(12) United States Patent
Farhadieh

(10) Patent No.: US 7,915,523 B2
(45) Date of Patent: Mar. 29, 2011

(54) COMPACT SOLAR APPARATUS FOR PRODUCING ELECTRICITY AND METHOD OF PRODUCING ELECTRICITY USING A COMPACT SOLAR APPARATUS

(76) Inventor: Rou Farhadieh, Oak Brook, IL (US)

( * ) Notice: Subject to any disclaimer, the term of this patent is extended or adjusted under 35 U.S.C. 154(b) by 566 days.

(21) Appl. No.: 11/688,008

(22) Filed: Mar. 19, 2007

(65) Prior Publication Data
US 2010/0108142 A1    May 6, 2010

(51) Int. Cl.
*H01L 31/052* (2006.01)
(52) U.S. Cl. ........ 136/259; 136/243; 136/244; 136/245; 136/246; 136/247; 136/248
(58) Field of Classification Search ............... 136/259, 136/243–248
See application file for complete search history.

(56) References Cited

U.S. PATENT DOCUMENTS

| | | | | |
|---|---|---|---|---|
| 3,536,908 | A | 10/1970 | Oster | 240/10.1 |
| 4,976,789 | A * | 12/1990 | Holloman et al. | 136/246 |
| 5,089,055 | A | 2/1992 | Nakamura | 136/248 |
| 5,438,485 | A | 8/1995 | Li et al. | 362/32 |
| 5,501,743 | A | 3/1996 | Cherney | 136/248 |
| 6,576,830 | B2 | 6/2003 | Nagao et al. | 136/244 |
| 6,617,507 | B2 | 9/2003 | Mapes et al. | 136/251 |
| 6,689,949 | B2 | 2/2004 | Ortabasi | 136/246 |
| 6,703,555 | B2 | 3/2004 | Takabayashi et al. | 136/244 |
| 6,717,045 | B2 * | 4/2004 | Chen | 136/246 |
| 6,730,840 | B2 | 5/2004 | Sasaoka et al. | 136/246 |
| 6,818,818 | B2 * | 11/2004 | Bareis | 136/246 |
| 6,953,487 | B2 * | 10/2005 | Cliche et al. | 29/623.2 |
| 2004/0187908 | A1 | 9/2004 | Muhs et al. | 136/246 |
| 2005/0034751 | A1 | 2/2005 | Gross et al. | 136/246 |
| 2005/0034752 | A1 | 2/2005 | Gross et al. | 136/246 |

FOREIGN PATENT DOCUMENTS

JP    2004-214423    7/2004

OTHER PUBLICATIONS

Fiber Optic Termination, Datasheet [online]. LANshack.com , 2003, Retrieved from <URL:http://web.archive.org/web/20030801170106/www.lanshack.com/fiber-optic-tutorial-termination.asp>.

* cited by examiner

*Primary Examiner* — Jennifer K Michener
*Assistant Examiner* — Matthew T Martin
(74) *Attorney, Agent, or Firm* — Timothy Harney

(57) ABSTRACT

The present invention relates to a compact solar module (CSM) apparatus and a method of producing electricity using such an apparatus in residential buildings for example. One embodiment of the module is made of two arrays of 2×4 solar cells. Each cell in the array has a surface area of 36 square inches for example. Each array covers an area of 1×2 square ft, generating 26.4 Watts of electricity. One CSM of this embodiment consists of 2×8 sub-CSMs, generating a total of 422.24 Watts, and having the assembled dimension of 27.5"× 21'×7.6". The compact feature of solar module relies on sunray transmission to the solar cells and their remote illumination through optical fibers and sets of concave and convex mirrors & lenses. Sunrays are collected and concentrated and condensed on the optical fiber bundles installed in light guides penetrating through a roof top and tracks sunrays during sunrays. To illuminate the entire surface of a photocell, an array of 2×2 mirrors/fibers arranged in a square configuration, are utilized. This configuration optimizes material usage, cost effectiveness and provides greater sun energy for PV cells illumination.

16 Claims, 23 Drawing Sheets

128 OPTICAL FIBERS FROM ONE CSM TERMINATED IN A LIGHT-GUIDE FERRULE

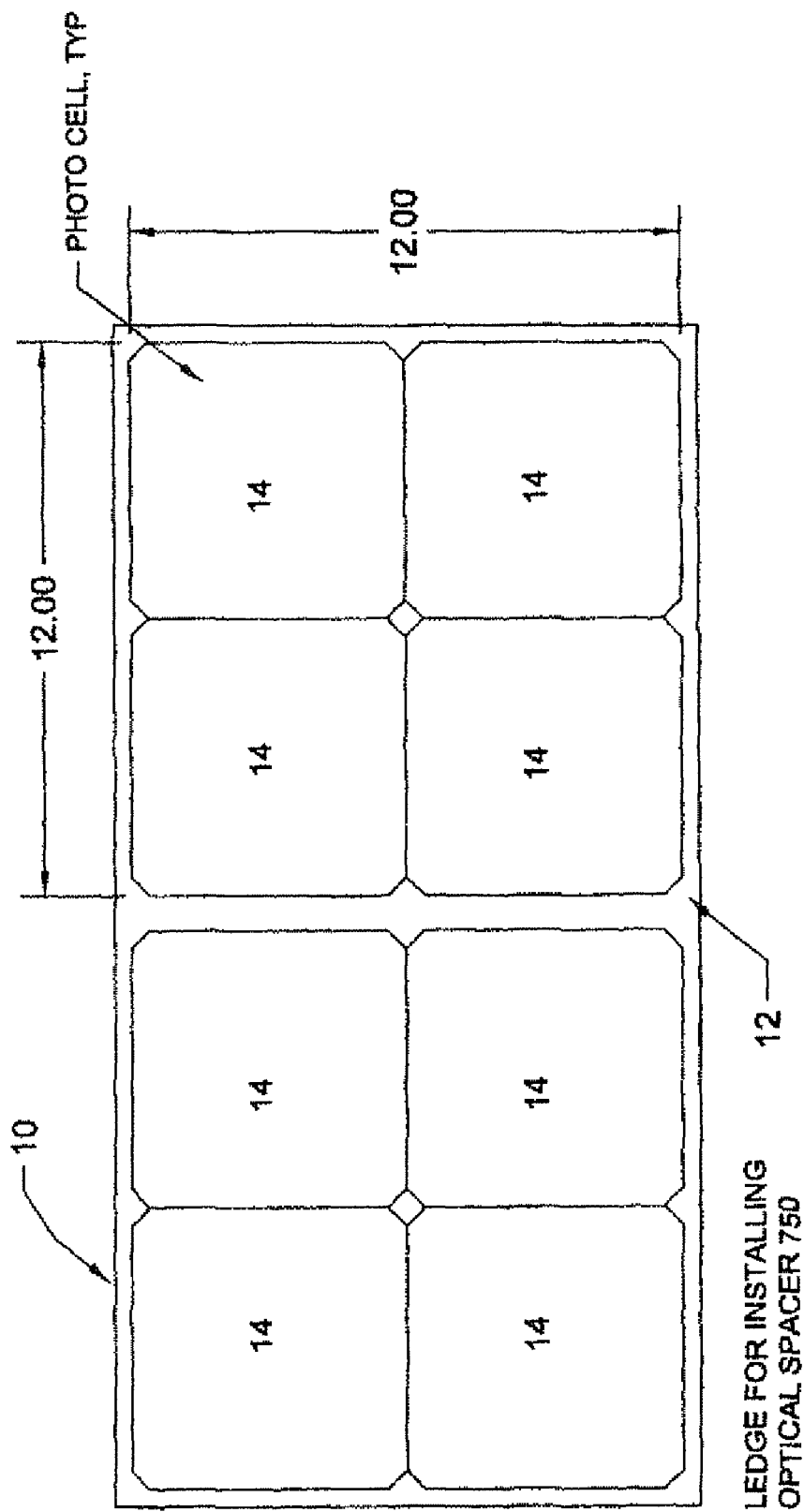
FIG. 1. A 2 x 4 ARRAY OF PHTOCELLS UTILIZED IN SUB-CSM OF THIS INVENTION

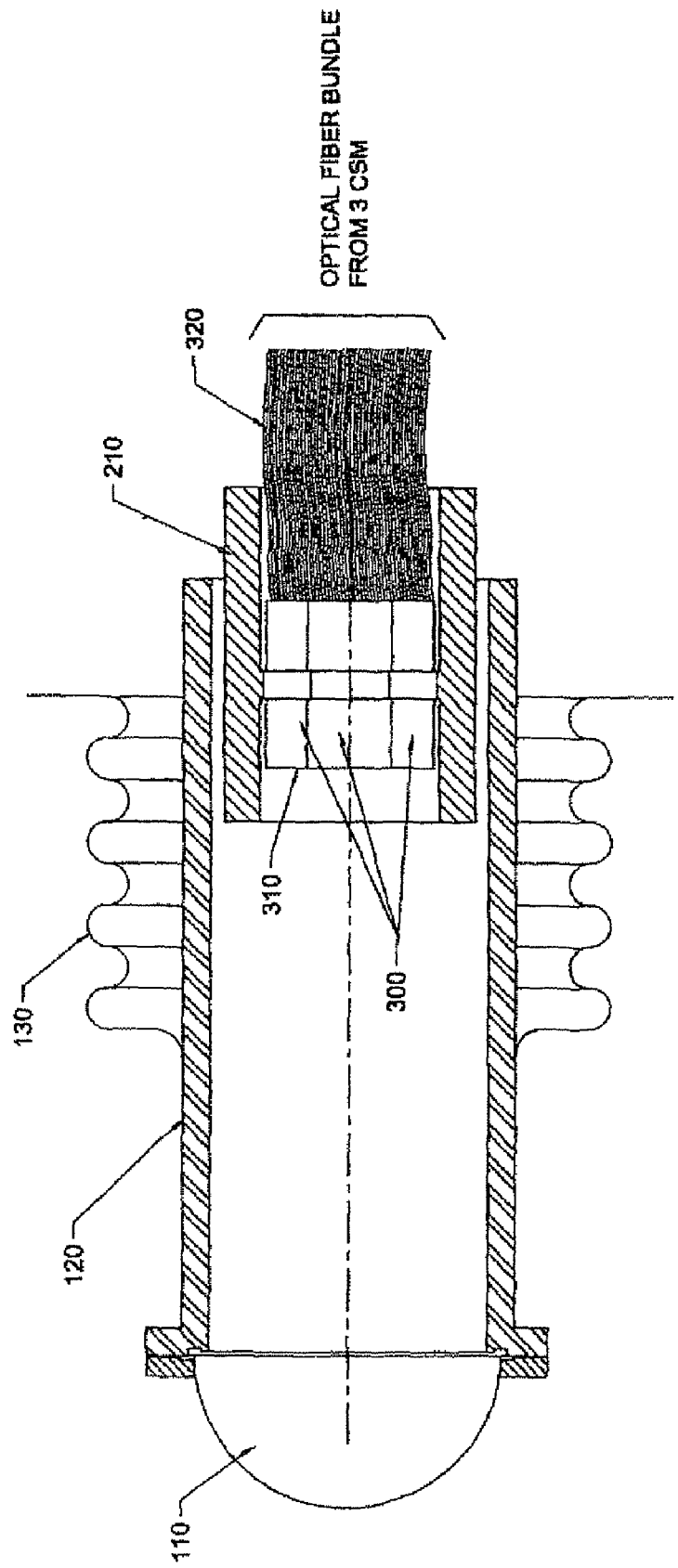
FIG. 2. ASSEMBLY OF 3 CSM FIBER OPTICS TERMINATED FERRULE IN LIGHT-GUIDE-TUBE FOR ROOF INSTALLATION.

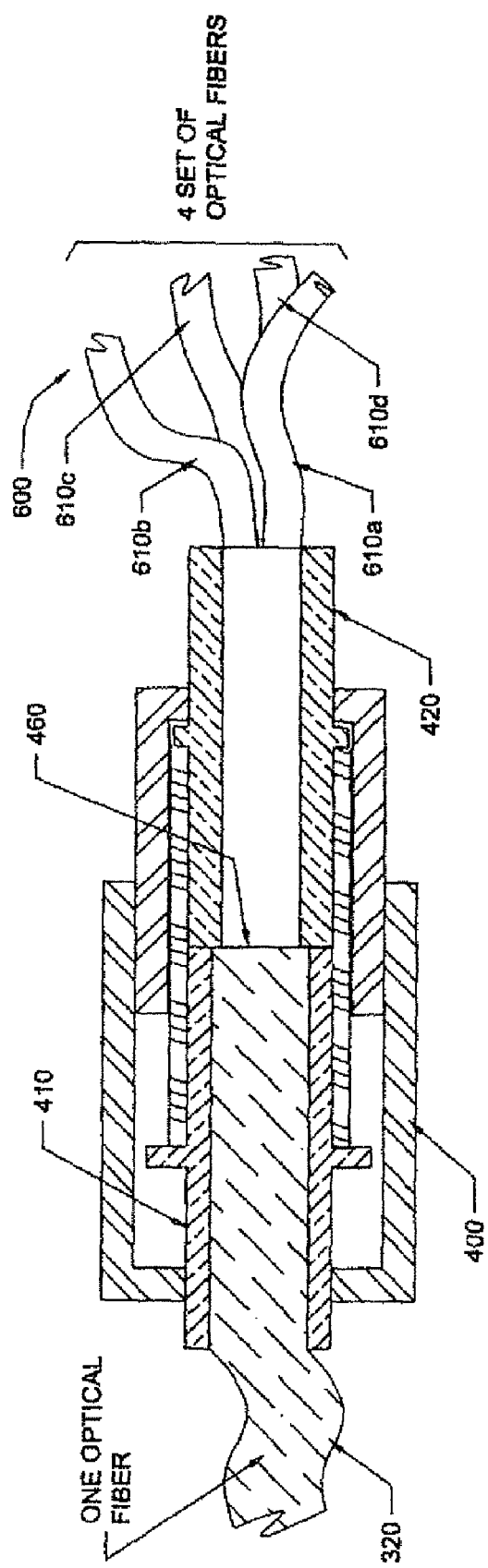
FIG 3. SINGLE TO MULTI OPTICAL FIBER COUPLER. SUNRAY TRANSMISSION FROM ONE TO FOUR SET OF OPTICAL FIBERS

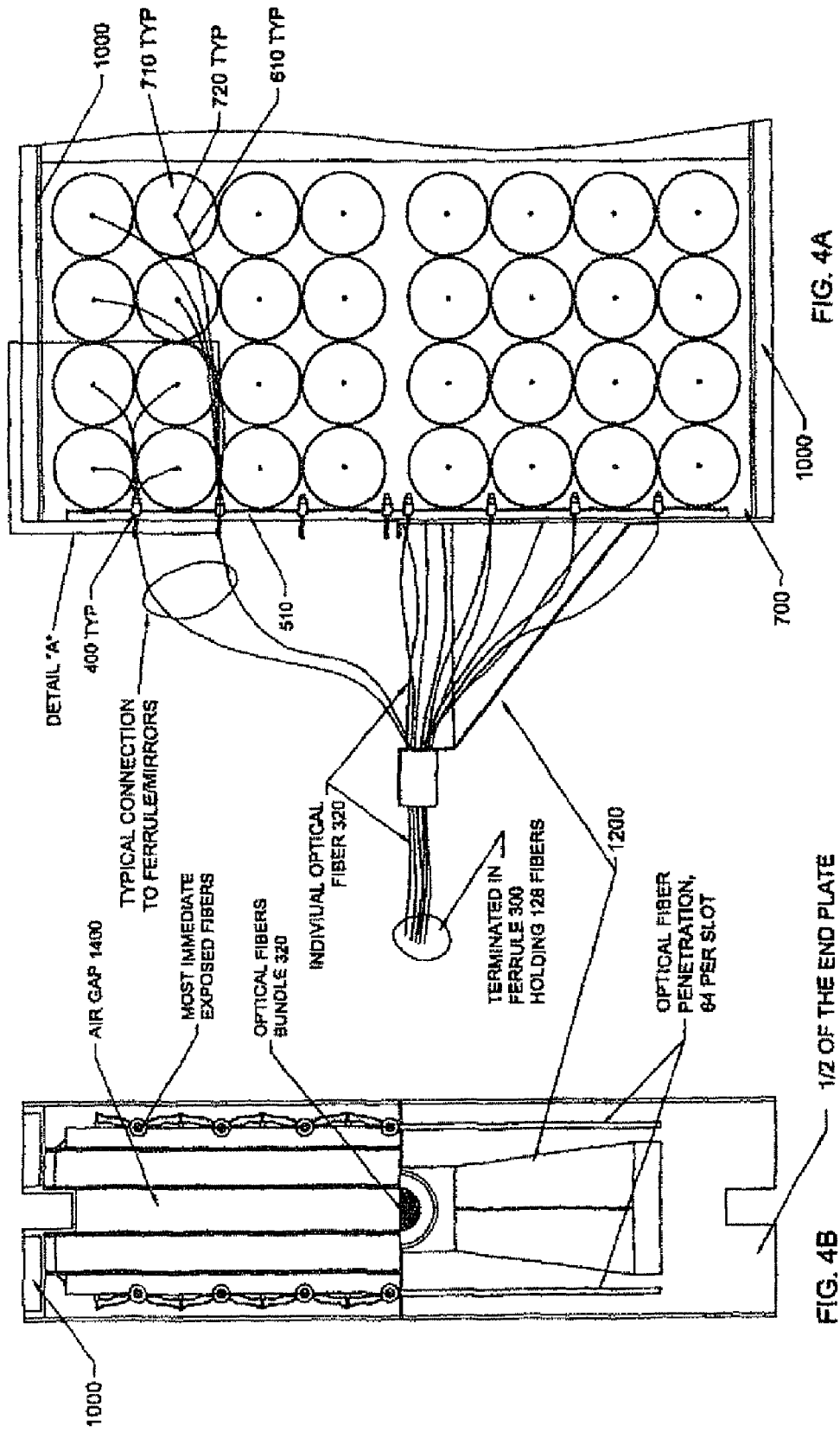

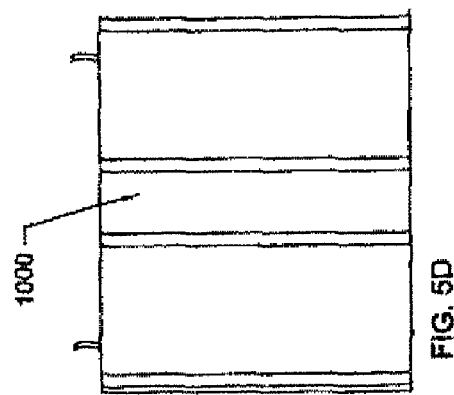
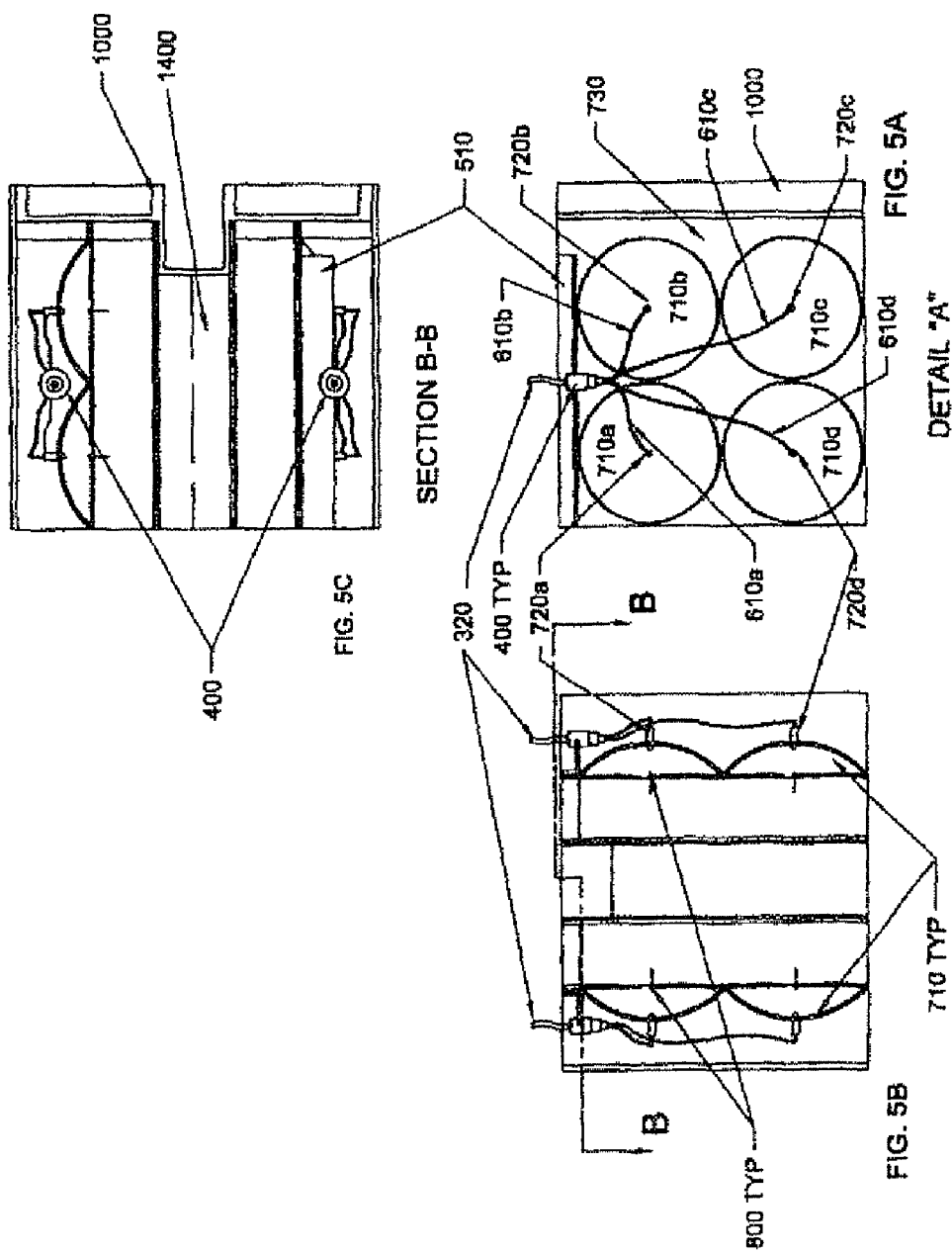

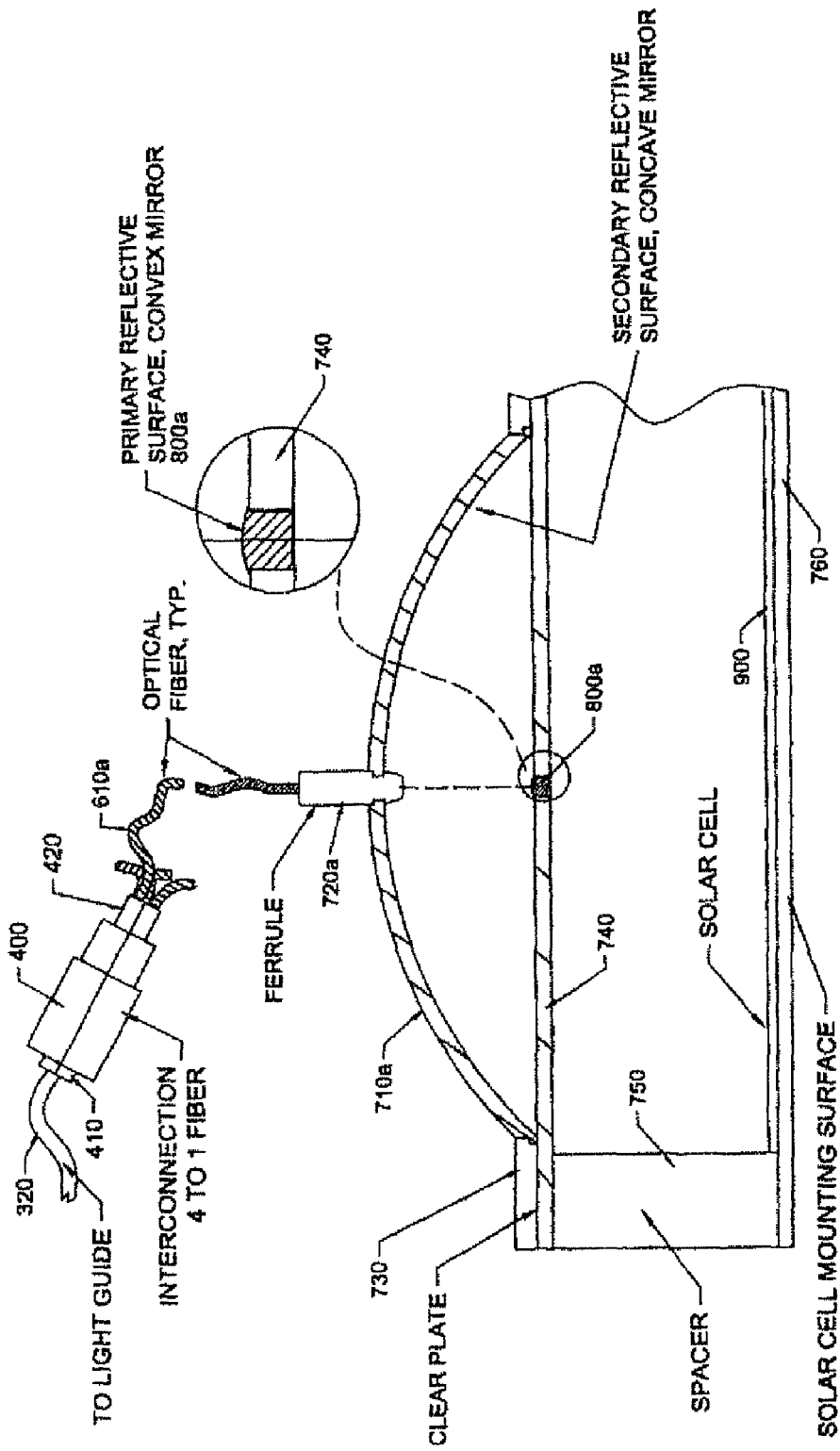
FIG. 6. 1/4 SECTIONAL VIEW OF FIG. 5 SHOWING SUNRAY TRANSMISSION PATHWAY & OPTICAL ARRANGEMENT FORM LIGH-GUIDE TO THE SOLAR CELL

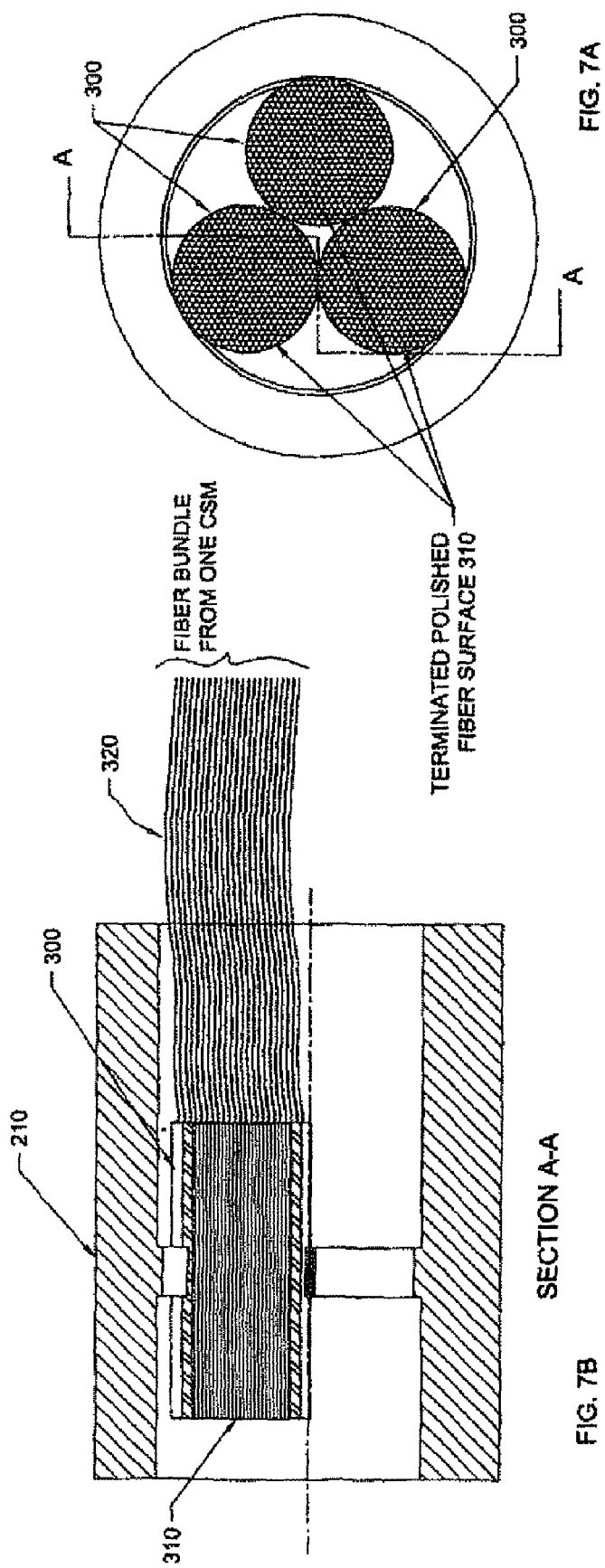

128 OPTICAL FIBERS FROM ONE CSM TERMINATED IN A LIGHT-GUIDE FERRULE

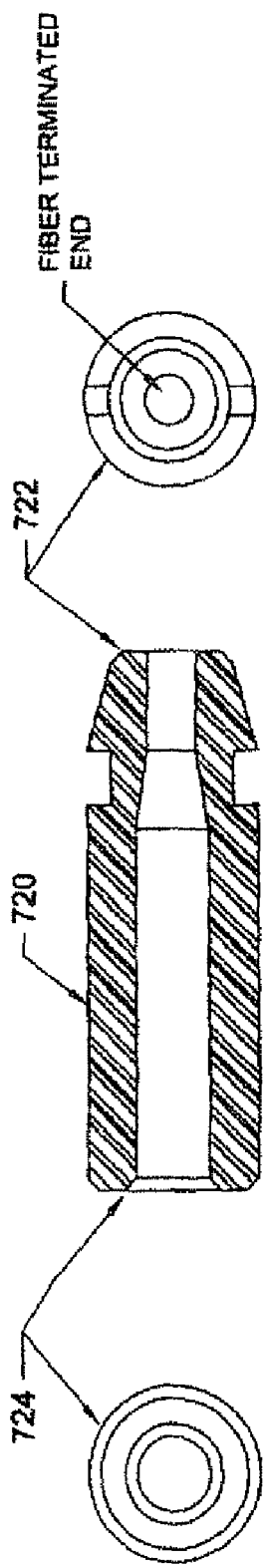
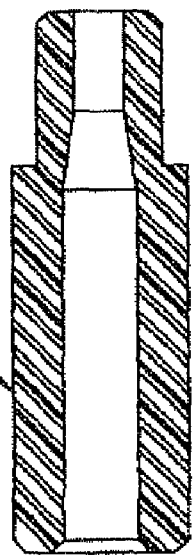
FIG. 9B — FIBER TERMINATED END
FIG. 9A
FIG. 9C
FIBER OPTICS FERRULE FOR ASSEMBLY IN CONCAVE MIRRORS

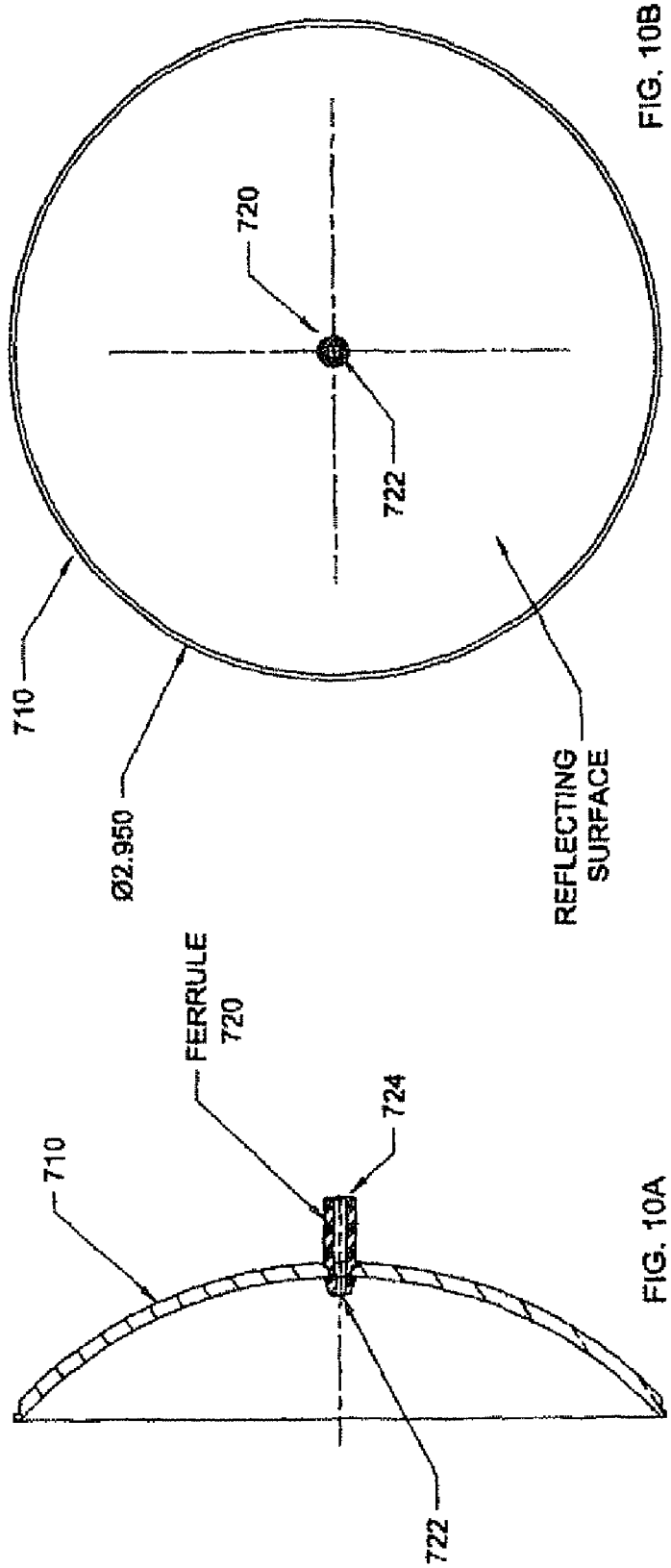

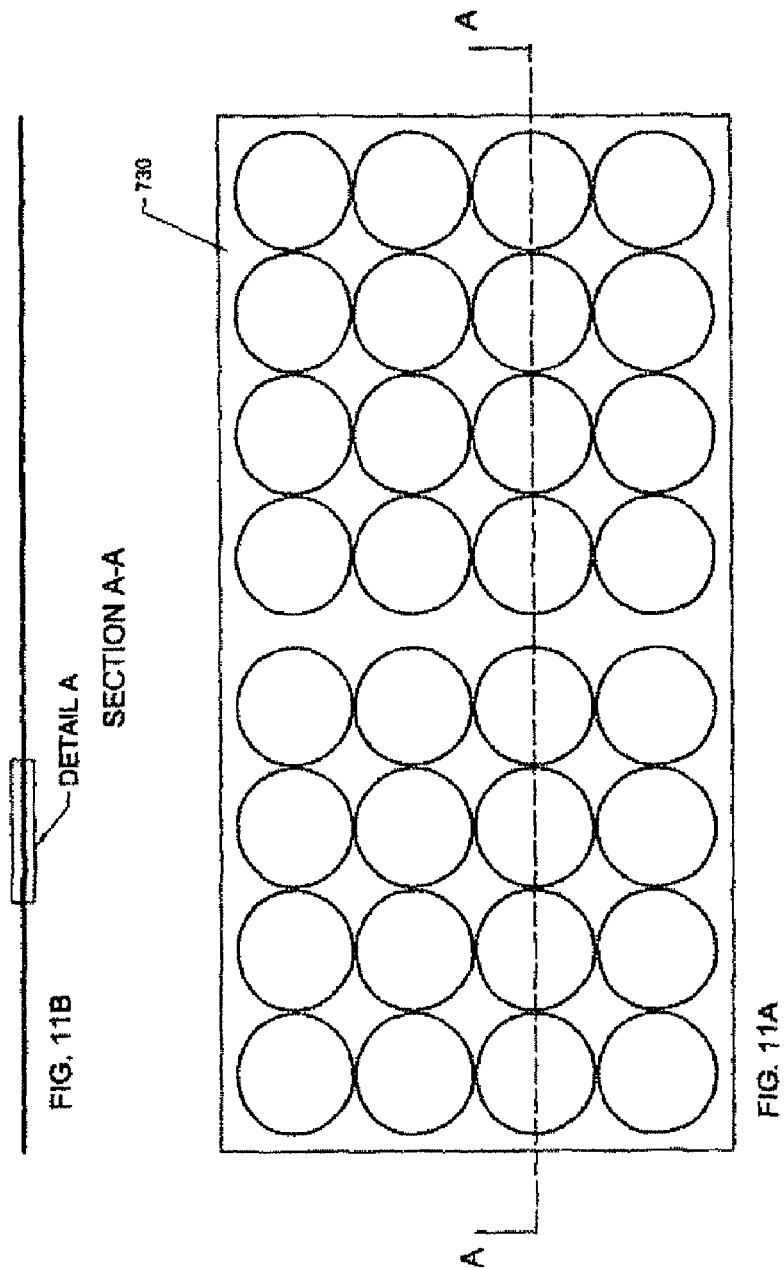

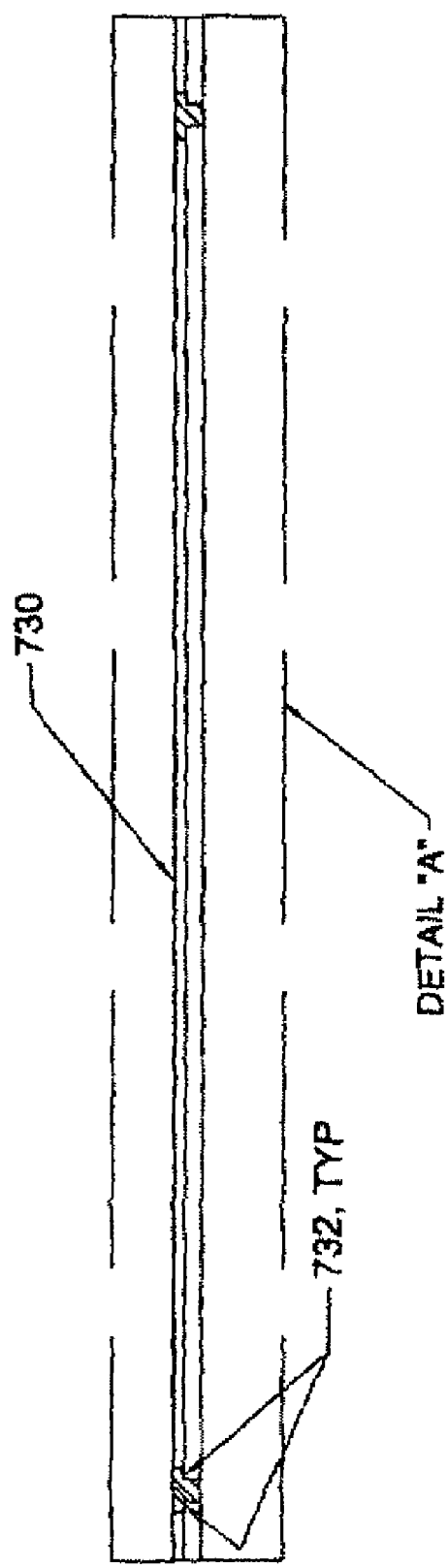
FIG. 11C. ENLARGEMENT OF DETAIL "A" OF FIG. 11.

RAY TRANSMISSION & CONVEX MIRROR HOLDER, A CLEAR PLATE

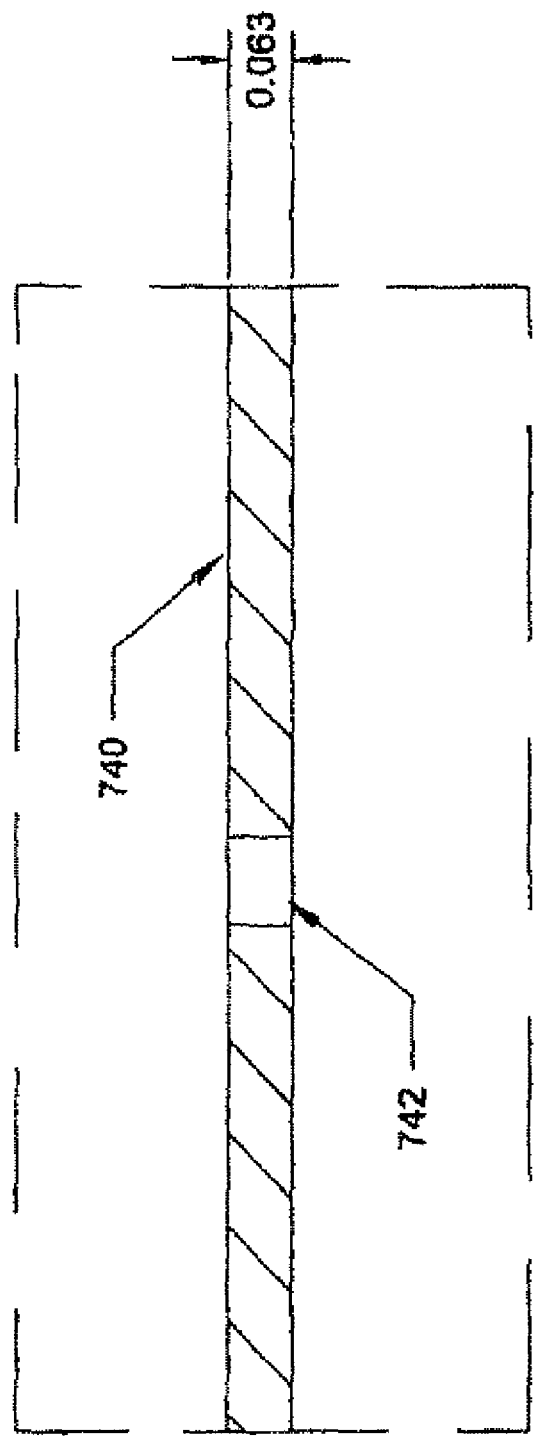
FIG 12C. ENLARGEMENT OF DETAIL "A" OF FIG 12

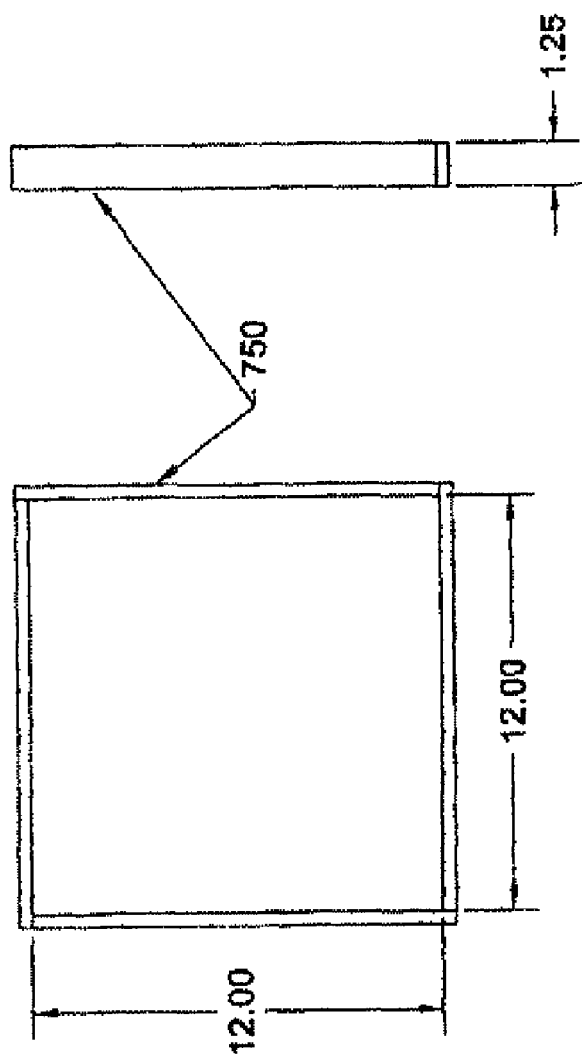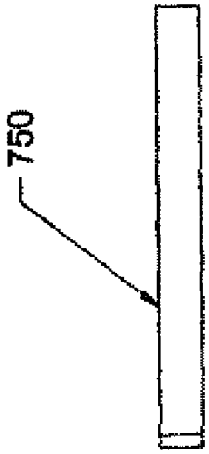

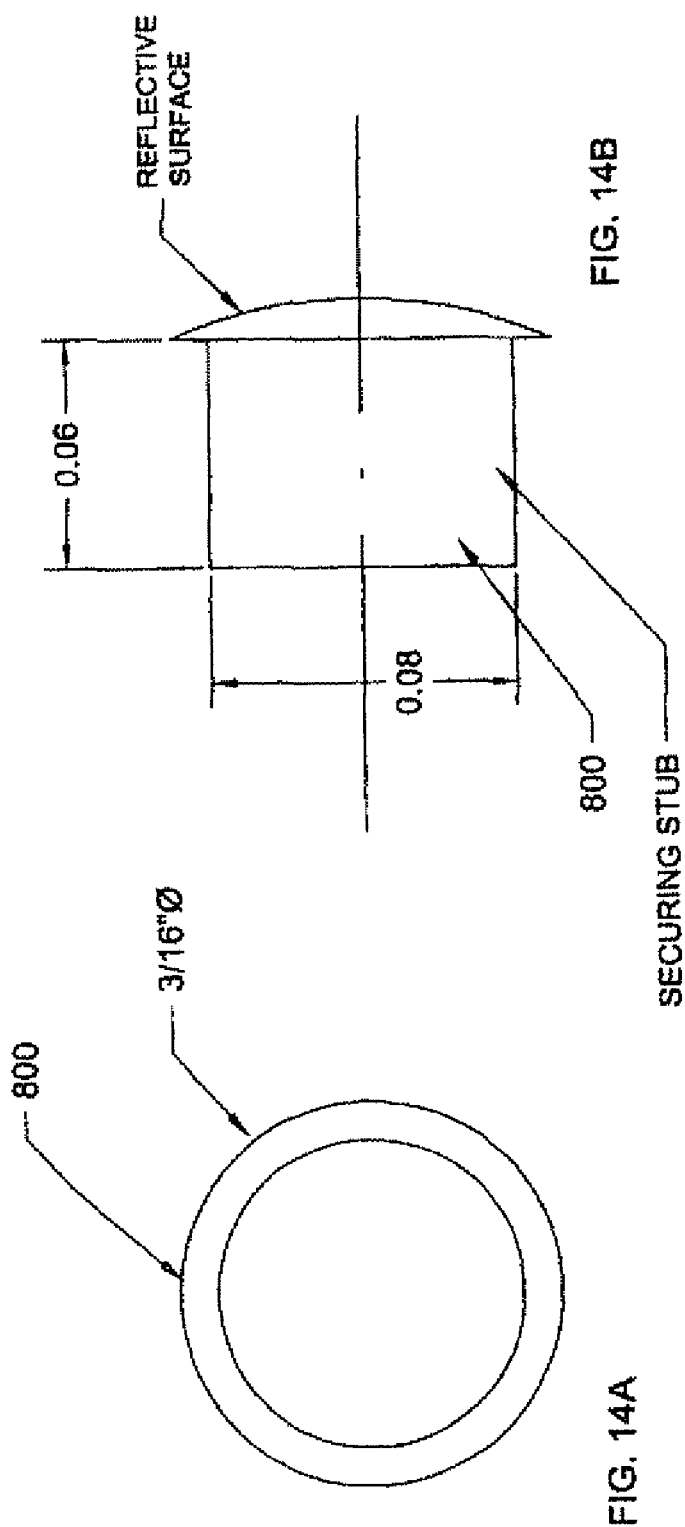

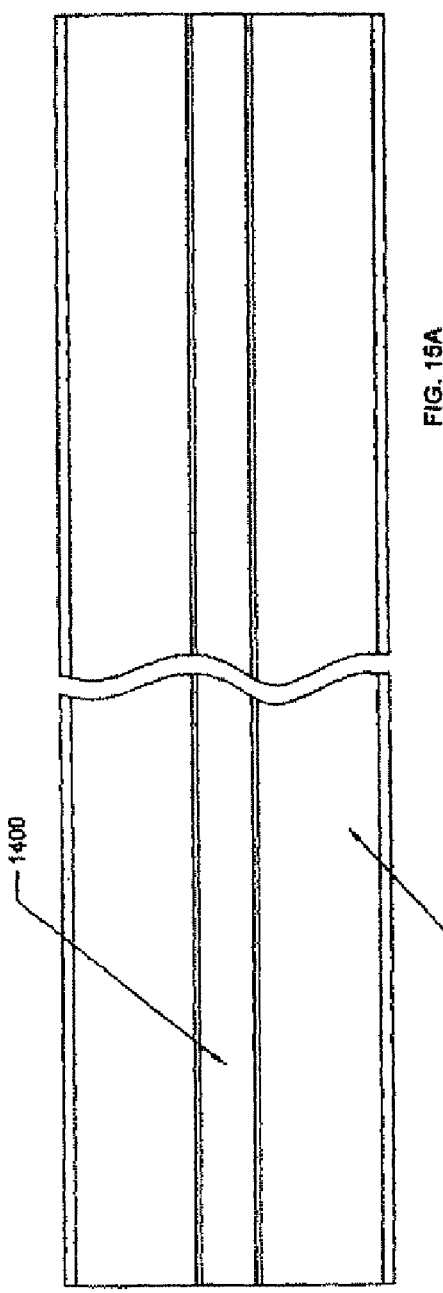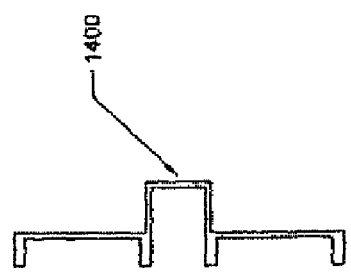
FIG. 15A
FIG. 15B
FIG. 15C
CSM SIDE SECURING CHANNEL

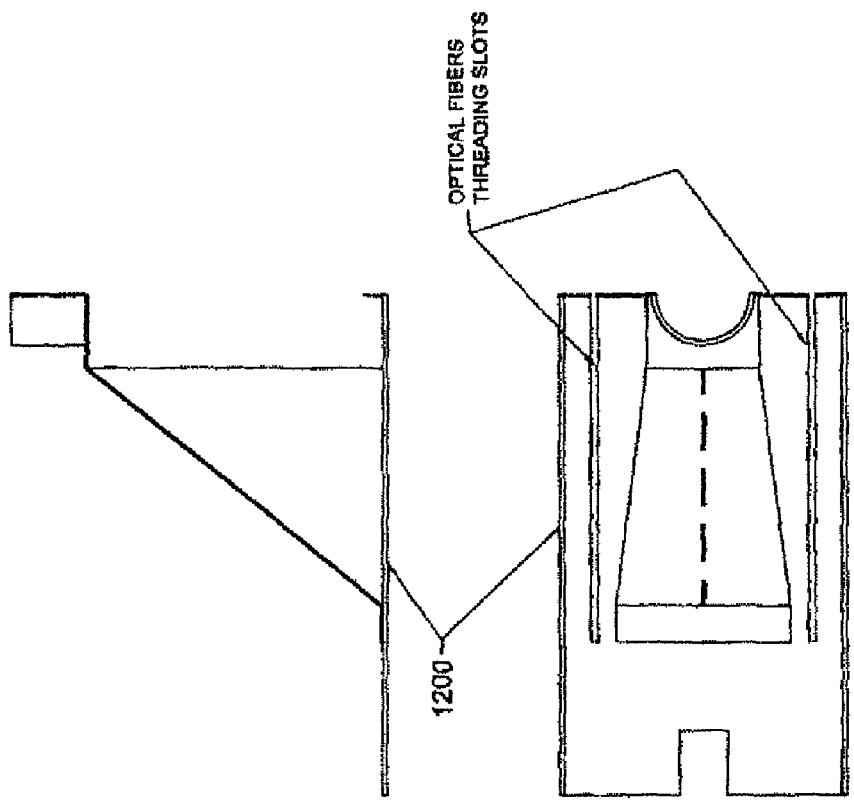

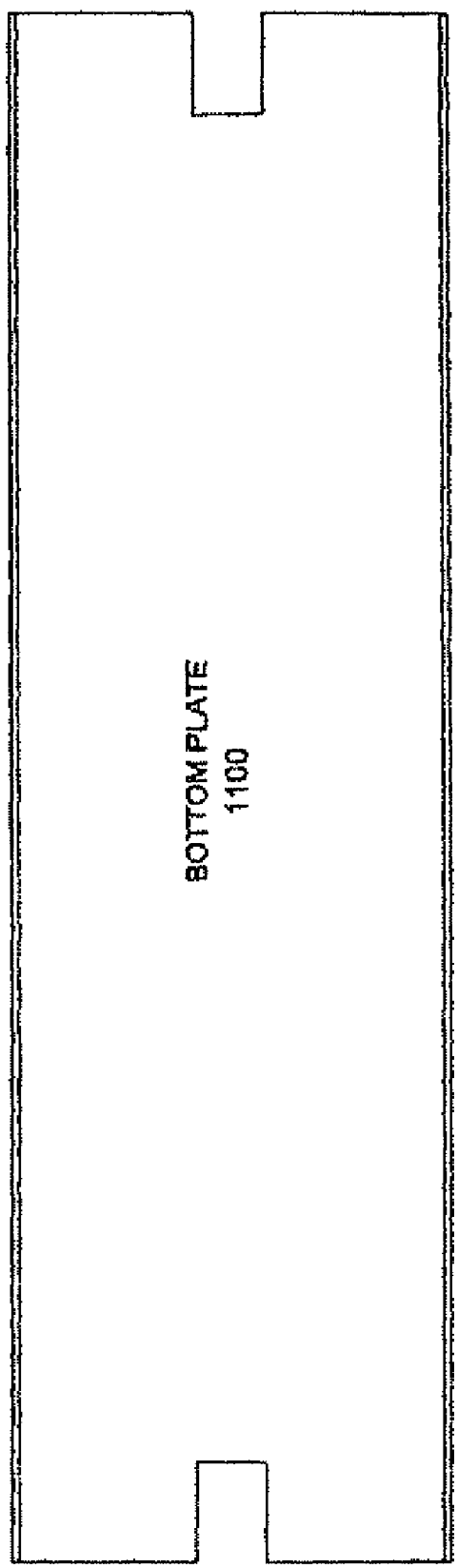
FIG 17. CSM BOTTOM END PLATES

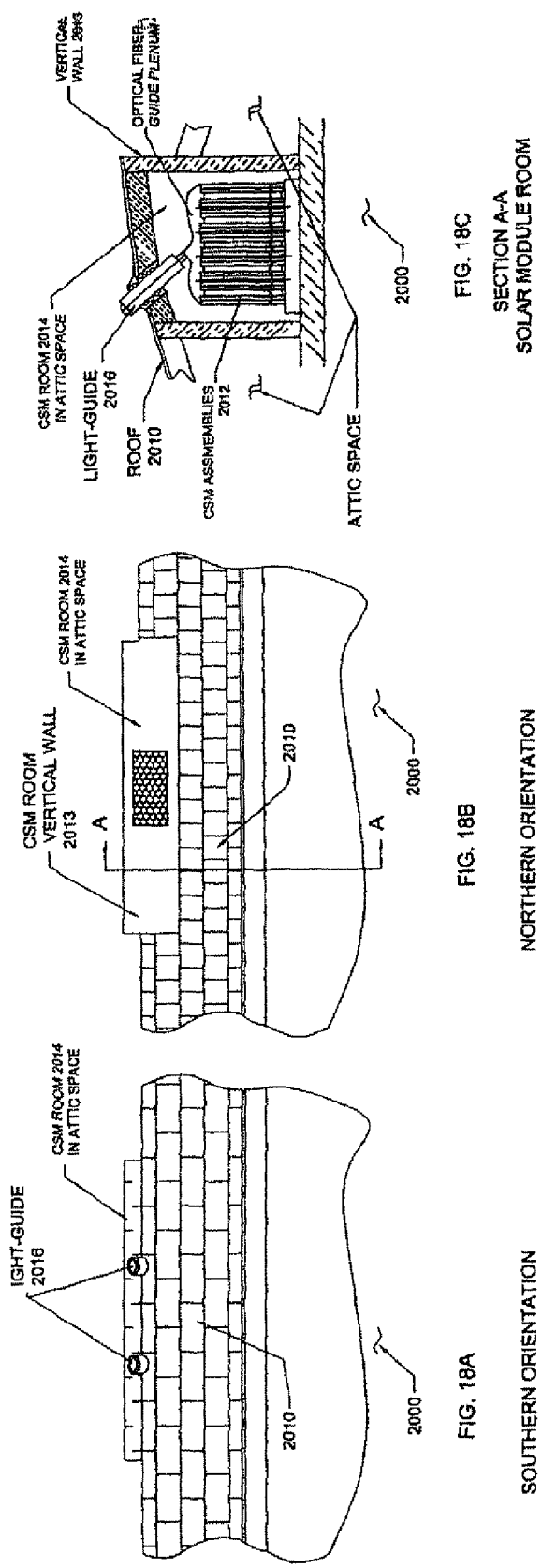

COMPACT SOLAR APPARATUS FOR PRODUCING ELECTRICITY AND METHOD OF PRODUCING ELECTRICITY USING A COMPACT SOLAR APPARATUS

CLAIM FOR PRIORITY

This application claims the benefit of and priority from, PCT/US2005/033615 filed Sep. 20, 2005 titled "Compact Solar Apparatus for Producing Electricity and Method of Producing Electricity" which claims priority from U.S. Provisional Application Ser. No. 60/614,289 filed Sep. 29, 2004 titled "Compact Solar Apparatus for Producing Electricity and Method of Producing Electricity Using a Compact Solar Apparatus" and Ser. No. 60/614,173 filed Sep. 29, 2004 titled "Method and Apparatus for Illuminating a Solar Cell" the complete subject matter of each of which is incorporated herein by reference in its entirety.

CONTRACTUAL ORIGIN OF INVENTION

Not Applicable.

BACKGROUND OF THE INVENTION

1. Field of the Invention

Embodiments are directed in general to the field of solar energy, but also include photovoltaic and fiber optics. Embodiments are directed in particular to a compact solar module apparatus and a method of producing electricity using such an apparatus.

2. Background of the Invention

Historically solar panels and solar tiles are installed on rooftops and are wired to invertors and batteries for storing the converted light energy into electricity. In existing art, a Solar Panel comprising an array of photovoltaic cells (crystalline or plastic film) is installed on a rigid surface, which is then encased in a rigid metal frame and covered by a glass plate. This arrangement is hermetically sealed to protect the cells from moisture and dust. Sun Rays transmitted through the glass cover are incident onto the PV cells; the excited atom in the cells generate electricity, which are stored in rechargeable batteries for conversion to AC power for any planned applications. Power generated from PV cells is limited by surface area of the rooftops. Known solar panels/tiles can provide, at most, 50% of a home's electric need.

Previous methods and apparatuses have been employed for producing electricity in the home. U.S. Pat. No. 6,576,830 B2, incorporated herein by reference in its entirety, describes a solar cell roof structure, a photovoltaic power generating apparatus, a building and a method of construction of a solar cell roof, in which a solar cell module is provided above a roof base of a building. An electrical wire for the solar cell module is provided in a space between the solar cell module and the roof base, and the electrical wire extends into a space at the back of the roof base through a through hole provided in the roof base. A base sealing member on the roof base is provided for covering the through hole and an exit is provided in the base sealing member through which the electrical wire extends into the space between the solar cell module and the roof base at a portion of the base sealing member other than a portion just over the through hole of the base sealing member. The base-sealing member can include a heat-resisting or fire resistive material on the roof base for covering the through hole.

U.S. Pat. No. 6,617,507 B2, incorporated herein by reference in its entirety, discloses a plurality of elongated rails, each of which has a lower base and an upper cap of an extruded resin construction defining a pair of grooves that open in opposite directions from each other to receive edges of rectangular photovoltaic modules so as to provide mounting thereof on a support surface. The photovoltaic modules are arranged in pairs with the modules of each pair abutting each other and with each pair of modules being spaced along the elongated lengths of the rails from each adjacent pair of modules to provide openings there between. Cross members extend between the lower bases of the rails to space the rails from each other and have upwardly opening shapes that receive electrical wiring.

U.S. Pat. No. 6,689,949 B2, incorporated herein by reference in its entirety, discloses a concentrating photovoltaic module that provides a concentration in the range of about 500 to over 1,000 suns and a power range of a few kW to 50 kW. A plurality of such modules may be combined to form a power plant capable of generating over several hundred megawatts. The concentrating photovoltaic module is based on a Photovoltaic Cavity Converter ("PVCC") for very high solar-to-electricity conversions. The use of a cavity containing a plurality of single junction solar cells of different energy band gaps and simultaneous spectral splitting of the solar spectrum employs a lateral geometry in the spherical cavity (where the cell strings made of the single junction cells operate next to each other without mutual interference). The purpose of the cavity with a small aperture for the pre-focused solar radiation is to confine or trap the photons so that they can be recycled effectively and used by the proper cells. Passive or active cooling mechanisms may be employed to cool the solar cells.

U.S. Pat. No. 6,703,555 B2, incorporated herein by reference in its entirety, comprises a plurality of solar cells interconnected in series and/or parallel, one positive terminal, and one negative terminal, wherein at least a part of an electric line is not housed in an insulating envelope. The line is grounded at an electrical middle point between the positive and negative terminals or a point on the side of the negative terminal with respect to the electrical middle point, whereby an environmental resistant coating significantly responsible for a cost of a solar cell module and an insulating coating of a member for interconnecting solar cells in series and/or parallel can be simplified, and safety of an exposed electric line resulting from the simplification of the environmental resistant coating and the insulating coating can be improved.

U.S. Pat. No. 6,717,045 B2, incorporated herein by reference in its entirety, relates to a solar photovoltaic array module design, which constitutes three steps of optical concentrations of photovoltaic electric power generation systems. A compound parabolic concentrator ("CPC") is mounted under a first optical concentrating fresnel lens that concentrates the intensity of sunlight to five times above normal level. The focused sunlight is further concentrated twenty times by the second optical concentrator CPC. The high mirror quality of CPC allows 98% of the reflected rays to be focused at the bottom of the CPC. At this point, the intensified sunlight passes through a third optical concentrator glass lens, which with anti-reflection coating on the top of the glass lens' surface, incident on the multi-junction solar cell accomplish the third optical concentration for the photovoltaic electric energy conversion.

U.S. Pat. No. 6,730,840 B2, incorporated herein by reference in its entirety, relates to a concentrating photovoltaic module comprising: a lightguide member having at least one exit face and a plurality of entrance faces; and at least one solar cell placed immediately after the exit face of the lightguide member; wherein the lightguide member is comprised of a light transmissive, solid medium having no refractive-index-discontinuity portion and a surface of the lightguide member is smooth. The lightguide member makes sunbeams incident on the plurality of entrance faces, totally reflected on side faces, and emergent from the exit face, whereby the sunbeams can be concentrated on the solar cell with high efficiency.

U.S. Patent Publication No. 2005/0034752 published Feb. 17, 2005, and Publication No. 2005/0034751 published Feb. 17, 2005 and an article titled "A Wall of Mirrors", Fortune Small Business, February 2005, pp. 40-41 disclose an apparatus for increasing or concentrating the amount of sunlight that strikes the solar cells. The disclosed apparatus uses a tracking heliostat array of optical elements (i.e., mirrors) to concentrate the light prior to its striking the cells.

PCT/US2005/033720 Application filed Sep. 20, 2005, which claims priority from U.S. Provisional Application No. 60/614,173 filed Sep. 29, 2004, each of which is incorporated herein by reference in its entirety, discloses a method and apparatus by which compact solar modules may be fabricated and sunrays transmitted through a set of light-guides to the cells placed in remote location of a house.

SUMMARY OF INVENTION

The present invention relates to a Compact Solar Module ("CSM") apparatus for use in residential building for example and a method of producing electricity using such an apparatus. One embodiment of the module comprises two arrays of 2×4 solar cells, each cell having a surface area of 36 square inches. Each array covers an area of 1×2 square ft, generating 26.4 Watts of electricity. One CSM consists of 2×8 sub-CSM assembled back-to-back, generating a total of 422.8 Watts, and having an assembled dimension of 27.5"×8'×7.6". The compact feature of at least one embodiment relies on sunray transmission to the solar cells and their illumination through optical fibers and sets of concave and convex mirrors & lenses. To illuminate the entire surface of a photocell, an array of 2×2 mirrors/fibers arranged in a square configuration may be utilized. This configuration optimizes material usage, cost effectiveness and provides greater sun energy for PV cells illumination.

It is contemplated that many combinations of solar cell arrays may be utilized. One or more arrays may comprise a single 6"×6" cell. In one embodiment, each cell may have a minimum of 4 and a maximum of 9 concave mirrors, for example, used to illuminate the entire surface of solar cell. For example, for an array of 1×2 cells, having a minimum of 4 and maximum of 9 concave mirrors per cell illuminating the surface of one cell; the total number of required mirrors would be 8 and 18, respectively. Further, for an array of 1×3 cells, similar to that described previously the total number of mirrors required for such an array would be 12 and 27, respectively. Similarly, for an array of 2×4 cells having a minimum of four and a maximum of 9 concave mirrors per cell, the total number of required mirrors would be 32 and 72, respectively. Furthermore, one or more of the arrays may be built to what ever number is physically possible and financially feasible.

For the purpose of discussion, one embodiment of an array of 2×4 cells in a sub-CSM is described, although other arrays are contemplated. Each cell has a surface area of 6×6 sq. inches, installed inside a rigid frame on a flat surface. For economic feasibility and ease of manufacturing, an array of 2×2 front-surface concave mirrors is selected for illumination of a single solar cell. Expanded sunrays from 4 front surface concave mirrors illuminate the entire surface of the cell, which is a typical arrangement for energizing each cell in the array. The optical arrangement that transmits sunrays from the roof to CSM positioned away therefrom (tucked away in a room for example) comprises a spherical lens installed at the end of a light-guide-tube which is attached to or penetrates a roof and focuses sunrays to a small diameter light source. The guide tube is southerly oriented and tracks the sun.

Concentrated sunrays, for example about 2" in diameter, strike the polished end of optical fiber bundles terminated in ferrules installed in the guide tube. The fiber bundles fan out to individual fiber optics; each of which is terminated in a ferrule in a coupler assembled in a sub-CSM module. The surface of the terminated, polished fiber comes in contact with surface of four individual fibers terminated in another ferrule in the same coupler. The interface of the mating fibers allows transmission of sunrays from a core of one fiber to a combined core of four fibers. The 4 fibers fan out and are terminated in four ferrules that are connected to and/or locked in the apex of four front-surface concave mirrors which form the 2×2 array of light source, illuminating a single solar cell.

When assembled, the axis of the ferrule/optical fiber is generally parallel to the mirror axis and generally perpendicular to the surface of the solar cell. The light from the fiber terminated in the ferrule is incident on a front-surface convex mirror about 3/16" diameter for example. The emerging sunray from the fiber end, incident on the surface of the convex mirror (primary reflective surface) reflects and expands, covering the entire surface of the concave mirror. The reflected light from the concave mirrors reflect through a clear plate that secures the convex mirror, illuminating the surface of the solar cell, about 1¼" away from the concave mirror.

The emerging, expanding sunray from each of the concave mirrors covers about surface area of the solar cells. In one embodiment, a 2×2 array of 4 mirrors are selected to illuminate the entire surface of a solar cell One sub-CSM consists of 8 solar Cells that are illuminated with 32 concave mirrors. 32 optical fibers terminated in 4 fiber ferrules within 8 couplers provide light source to 32 concave mirrors. 32 optical fibers initiate from each sub-module, which illuminate 8 6"×6" solar cells. The CSM of this illustrated embodiment contains 2×8 sub-modules on each side, or 16 sub-CSM on both sides. Fibers from each assembled sub-CSM are bundled and inserted into a common ferrule (about 2" in diameter for example), which is fixed at the lower end of the light-guide. One assembled CSM contains two sets of 8 sub-CSM's are assembled back to back with air space in between to act as a cooling air-duct. This arrangement provides for air circulation from the base upward. A completely assembled CSM of at least one embodiment of this invention measures 27.5" wide×8' high× 7.6" deep. A number of these modules can be assembled side-by-side and/or back-to-back to provide the needed power for daily use of a home and charging of the batteries for off sunlight hours.

Yet another embodiment of the present invention relates to an apparatus for producing electrical power comprising at least one converter, at least one reflector spaced from the converter and at least one ferrule coupled to the reflector. The converter (a solar cell for example) is adapted to convert light to electrical power; the receiver receives the light and produces reflected light that illuminates at least a portion of the reflector; and the ferrule has light emerging from an end thereof. At least one embodiment comprises a frame, wherein at least the converter is joined to the frame. This embodiment of the apparatus may further consists of the reflector comprising at least one set of primary and secondary reflective surfaces adapted to receive light and produce light that illuminates an entire surface of at least one of the primary and secondary reflective surfaces. It is contemplated that the primary and/or secondary reflective surface comprises at least one of a spherical convex mirror, a concave mirror or some combination, the front surface of one or more of which may be nickel or enhanced aluminum coated or some combination thereof (while only the front surface is discussed, both surfaces or sides may be coated with the same or different material).

Still another embodiment relates to an apparatus for producing electrical power, where the apparatus comprises a frame; at least one solar cell positioned in the frame; at least one set of primary and secondary reflective surfaces spaced from the solar cell; and at least one ferrule coupled to at least one of the reflective surfaces and adapted to have light emerge from an end thereof. The solar cell is adapted to convert light to electrical power; while the primary and secondary reflective surfaces received the light and produce reflected light that illuminates an entire surface of at least one of the primary and secondary reflective surfaces. It is contemplated that the primary and/or secondary reflective surface comprises at least one of a spherical convex mirror, a concave mirror or some combination, the front surface of one or more of which may be nickel or enhanced aluminum coated. Further, the ferrule may be coupled to the secondary reflective surface.

BRIEF DESCRIPTION OF DRAWINGS

The invention together with the above and other objects and advantages will be best understood from the following detailed description of the FIG. 1 depicts a plan view of a solar apparatus having a surface on which one or more photovoltaic modules (6"×6" modules for example) are installed in a array (a 2×4 array for example) and having a predetermined spacing (¾" for example) between each array.

FIG. 2 depicts a cross sectional view of a light-guide-tube used in or with the solar apparatus of FIG. 1 having a spherical lens adapted to be installed with an exposed end penetrating a building roof.

FIG. 3 depicts a cross sectional view of a fiber optic coupler used with at least the light guide of FIG. 2 allowing light transmission from 1 to 4 fibers, each being terminated in 1 ferrule in an array of mirrors (a 2×2 array for example) illuminating one solar cell.

FIG. 4A depicts a plan view of one assembled sub-CSM containing an array of solar cells (a 2×4 array arranged back to back for example).

FIG. 4B depicts an end view of one assembled sub-CSM containing an array of solar cells (a 2×4 array on each side for example) illustrating a portion of an installed top end plate with a fiber threaded through a slot in the top-end plate.

FIG. 5A depicts an enlarged view of Detail "A" of FIG. 4A illustrating the assembly detail of the fiber terminated ferrules, concave mirrors and a solar cell in an array of concave mirrors (2×2 concave mirrors for example) illuminating one solar cell (a 6"×6" solar cell for example).

FIG. 5B depicts a side view of Detail "A" of FIG. 5A illustrating the assembly detail of the fiber terminated ferrules, concave mirrors and solar cell.

FIG. 5C depicts a cross sectional view of Detail "A" of FIG. 5B taken along line B-B.

FIG. 5D depicts a side view of Detail "A" of FIG. 5A, showing the end cover plate.

FIG. 6 depicts an enlarged partial cross-sectional view of FIGS. 5A, 5B, 5C & 5D illustrating detail of light transmission from a single optical fiber to ¼ of the solar cells of FIGS. 5A, 5B, 5C & 5D positioned a fixed distance from the concave mirror.

FIG. 7A depicts an end view of an assembly of 3 ferrules each containing 128 optical fibers installed in an alignment tube, each of these ferrules containing the fibers from one fully assembled CSM.

FIG. 7B depicts a sectional view of the assembly of the optical fibers ferrules of FIG. 7A taken along line A-A.

FIG. 9A depicts an optical fiber ferrule for terminating a single optical fiber; this ferrule coupled to or locked in the apex of concave mirror.

FIG. 9B depicts a view of one end of the optical fiber ferrule of FIG. 9A from which light emerges.

FIG. 9C depicts the opposing end of the optical fiber ferrule of FIG. 9B that the fiber is inserted.

FIG. 10A depicts a side cross sectional view of the assembly of the secondary reflective surface or concave mirror and the optical fiber ferrule of FIGS. 9A-9C.

FIG. 10B depicts a plan view of the concave mirror of FIG. 10A with an assembled ferrule at the peak.

FIG. 11A depicts a flat clamp adapted to hold down a total of 32 Concave Mirrors.

FIG. 11B depicts a cross sectional view the 32 concave mirrors of FIG. 11A taken along line A-A illustrating one embodiment of the clamp used to secure the concave mirrors.

FIG. 11C depicts an enlarged cross sectional view of detail A of FIG. 11B, showing a typical step in the clamp that secures the concave mirrors.

FIG. 12C depicts an enlarged partial cross sectional view of the clear, light transmitting plate of FIGS. 12A-12B, showing a typical hole that secures the primary reflective surface, convex mirror.

FIG. 13A depicts a plan view of an optical spacer providing the predetermined fixed distance between the concave mirror and the photovoltaic cell required for expansion of the reflected sunray from the concave mirror.

FIG. 13B depicts a side view of the optical spacer of FIG. 13A.

FIG. 13C depicts an elevational view of the optical spacer of FIGS. 13A-13B.

FIG. 14A depicts an end view of a primary reflective surface or convex mirror.

FIG. 14B depicts a side view of the convex mirror of FIG. 14A.

FIG. 15A depicts a plan view of a side channel adapted to assemble a complete CSM.

FIG. 15B depicts an elevational view of the side channel of FIG. 15A.

FIG. 15C depicts an end view of the side channel of FIGS. 15A-15B.

FIG. 16A depicts a plan view of 36 of top end plate for covering the assemble CSM and threading thru and securing the optical fibers from the sub-CSM, where the part is made of two identical halves.

FIG. 16B depicts a side elevational view of the top end plate of FIG. 16A.

FIG. 17 depicts a plan view of a bottom plate for covering the assembled CSM.

FIG. 18A depicts a partial view of a building rooftop having a southern orientation illustrating one example of an assembled CSM for providing electricity.

FIG. 18B depicts a partial view of a building rooftop similar to that of FIG. 18A having a northern orientation illustrating one example of an assembled CSM.

FIG. 18C depicts a cross sectional view of the building of FIG. 18B taken along line A-A illustrating a set of modules installed in a dedicated room under the roof and the penetration of the optical guides through the roof.

DETAILED DESCRIPTION OF THE INVENTION

Figures 8A, 8B:
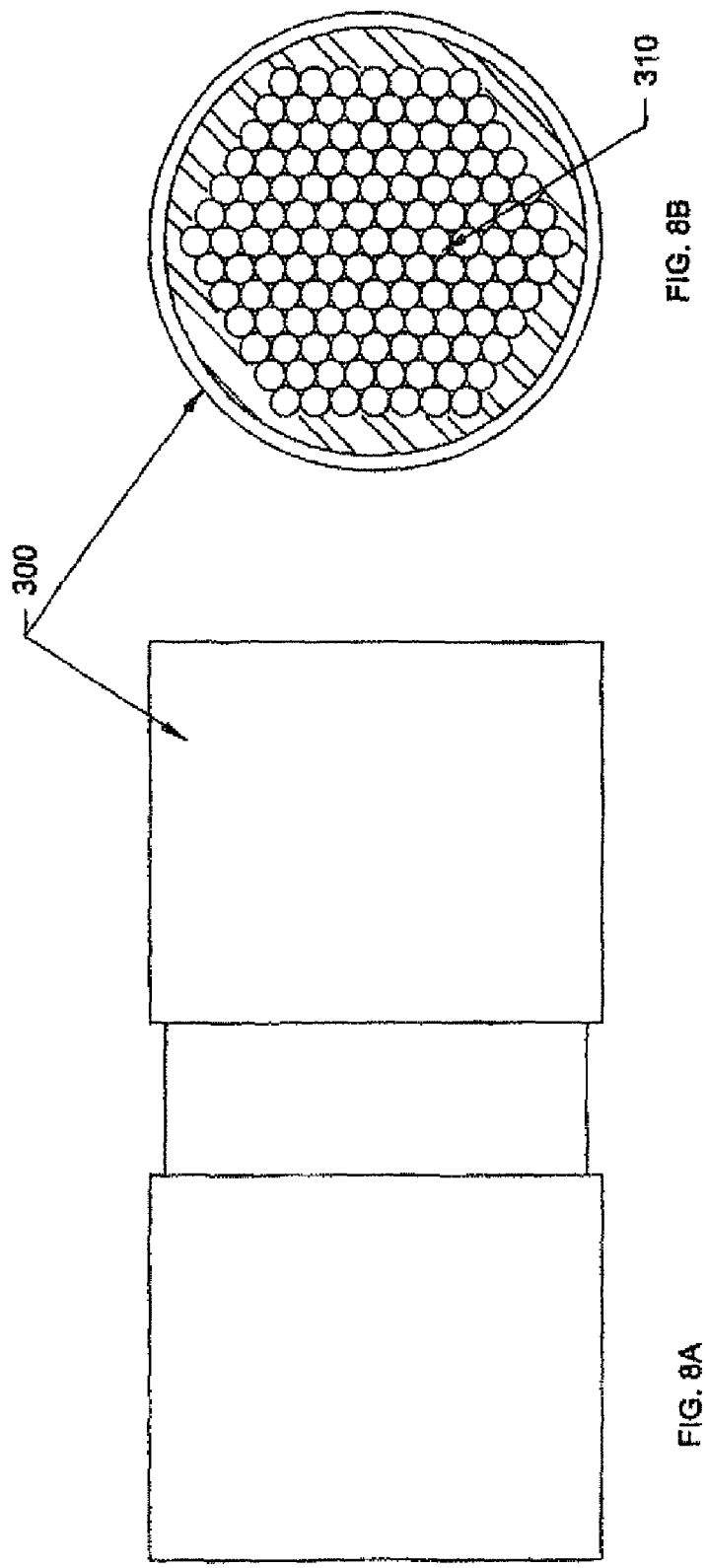
FIG. 8A depicts a plan view of one ferrule containing 128 optical fibers of one assembled CSM.
FIG. 8B depicts an end view of the ferrule of FIG. 8A, containing 128 polished fibers.

One embodiment relates to a sub-CSM array (a 2×4 array for example). One or more of the sub-CSM arrays may be assembled into a CSM module. However, other configurations are equally viable. At least one embodiment is described from exposed components on a rooftop progressing to single cell and expanding to a sub-CSM. Finally, a description of one CSM assembly is provided.

FIG. 1 depicts a solar apparatus 10 having a surface 12 on which one or more photovoltaic modules or solar cells 14 (6"×6" modules for example) are positioned or installed in an array (a 2×4 array for example). In at least one embodiment, each solar cell 14 has a surface area of 36 square inches and each array covers an area of 1×2 square ft, generating 26.4 Watts of electricity. Every 2×2 array of cells 14 are installed in a square pattern with a predetermined space (a ¾" space for example) between each of the arrays.

FIG. 2 depicts a light-guide-tube 120 used in or with the solar apparatus 10 of FIG. 1 having a spherical lens 110 with a first or exposed end adapted to penetrate or extend from the building roof. The second or other end is fitted with one or more ferrules (3 ferrules for example), each of which carries 128 optical fibers from one CSM. More specifically, FIG. 2 depicts spherical lens 110 located at one end of the light-guide-tube 120 adapted to be installed with a southerly orientation on a roof. The lens 110 is positioned such that incident sunrays onto the lens 110 are parallel to the optical axis of the lens 110 and the light-guide-tube 120. The light-guide 120 is secured to the roof through a set of stainless steel bellows 130 for example, which allows for directional movement of the guide 120. Bellows 130 provide an environmental seal between the outdoor and the interior of the roof, acting as rain/snow/moisture barrier. The other end of the guide 120, interior to the roof may be attached to a motorized gimbal mechanism, which may, for example, be software controlled through a Program Logic Controller ("PLC") or other controller device. The purpose of the universal gimbal mechanism provides year-around sun tracking during daylight hours.

In at least one embodiment, the optical axis of the condensing lens 110 is generally parallel to and coincident with the axis of the light-guide-tube 120. The focal length of the lens 110 is selected such that the sunrays are concentrated to a predetermined beam diameter (a 2" diameter beam for example), focusing on the polished end of the optical fiber bundles 310 (containing a plurality of fibers 320) in ferrules 310. Ferrule 210 of FIG. 2 houses 3 ferrules 300, FIG. 7. In the illustrated embodiment, three ferrules 300 are shown disposed or positioned in ferrule 210. The focal length of the condensing lens 110 is selected such that the polished fiber ends in ferrule 300 can view sunrays at the viewing angle (greater than 100 Degrees for example).

FIG. 3 depicts one example of a fiber optic coupler 400 used with at least the light-guide 120 of FIG. 2, allowing light transmission from 1 to a plurality of fibers (4 fibers are illustrated), each of the plurality of fibers being terminated in one ferrule in an array of mirrors (a 2×2 array for example) illuminating one solar cell. Out of each ferrule 300 (best viewed in FIGS. 2 and 7) extend a plurality of individual fibers 320 (128 fibers for example) that fan out and are each terminated in ferrules 410 in couplers 400. The emerging sunlight from the polished end of fibers 320 in ferrules 410 is transmitted to fibers 610 (four fibers 610a, 610b, 610c & 610d for example) in ferrule 420 in coupler 400. In at least one embodiment, the core of fiber 320 covers the combined cores of the fibers 610 at interface 460.

FIGS. 4A, 4B, 5A, 5B, 5C & 5D depict an example of an assembled sub-CSM containing an array of solar cells (a 2×4 array arranged back to back for example) having a fiber threaded through a slot in top-end plate 1200. Specifically, these figures depict coupler 400 secured to bracket 510 at an outside edge of each sub-CSM 700. The terminated fibers 610 (610a, 610b, 610c & 610d) extending out of ferrule 420, fan out and are terminated in a plurality of ferrules 720 (4 ferrules 720a, 720b, 720c & 720d for example) located at the apex of concave mirrors 710 (best viewed in FIGS. 10A & 10B). It should be appreciated that while 4 concave mirrors 710 (mirrors 710a, 710b, 710c & 710d) are illustrated and discussed, a different number and arrangement (i.e., convex mirrors or some combination of concave and convex mirrors) are contemplated. The polished end of fiber 610 is terminated in ferrule 720, which, in at least one embodiment, lies slightly below the surface and at the apex of the concave mirror 710 (best viewed in FIG. 6). FIG. 6 depicts an enlarged partial cross-sectional view of FIGS. 5A, 5B, 5C & 5D illustrating the detail of light transmission from a single optical fiber to the solar cells positioned a predetermined fixed distance from the concave mirror. As illustrated, mirrors 710 (mirror 710a is shown) are fixedly or removably secured, by mirror clamp 730 for example, to a clear or ray transmission plate 740, which in at least one embodiment, is comprised of clear hexon or polycarbonate. In the illustrated embodiment, clear plate 740 is removably or fixedly secured to optical spacer 750. This full assembly is removably or fixedly secured to plate 760, on which lies one or more solar cells 900.

The front-surface convex mirror 800 (mirror 810a is illustrated) is removably or fixedly secured onto or positioned in clear plate 740, whose optical axis is coincident with the optical axis of the ferrule 720 (ferrule 720a is illustrated) and/or fiber 610 (fiber 610a is illustrated) coupled to or locked in the apex of concave mirrors 710. It should be appreciated that, while convex mirror 800 is illustrated and discussed, concave mirrors or some combination of convex and concave mirrors is contemplated. In at least one embodiment, the primary reflective surface comprises a front-surface nickel-plated convex mirror 800. The light-emerging, polished surface of the fiber 610, terminated in ferrule 720, is located inside the focal plane of the mirror 800. This arrangement allows emerging sunray(s) to be reflected and cover a portion, if not the entire surface, of the concave mirror 710.

In at least one embodiment, the optical axis of the concave mirror 710 is generally perpendicular to the surface of the solar cell 900. The emerging sunray(s) expand after incident on the primary reflective surface 800, covering a portion, if not the entire surface, of the secondary reflector (i.e., concave mirror 710), at least the front-surface of which may be nickel-plated. The light reflecting from the secondary reflector penetrates the clear plate 740 and expands slightly, covering about ¼ of the surface of solar cell 900. Optical spacer 750 provides the predetermined distance for the geometrical optic configuration, ensuring light coverage of ¼ surface of the solar cell. In the illustrated embodiment, four mirrors 710 as configured cover the entire surface of a single solar cell 900.

In another embodiment, one or more off-axis parabolic mirrors may replace the concave mirrors 710. This may also result in the elimination of clear plate 740. In this embodiment, the light-carrying fiber-terminated ferrules 720 are secured in the mirror clamp plate 730, and the convex mirrors 800 are installed on the solar cell mounting plates 760, along the optical axis of the parent parabola and at the focal plane of the parabolic mirrors. In this arrangement, the focal plane of the parabolic mirrors is, for example, 30 mm. One advantage of this arrangement belies the creation of reflected, unobstructed sunrays that can illuminate the entire surface of one or multiple PV (photo voltaic) cells.

FIGS. 7A & 7B depict an assembly of optical fiber ferrules. Specifically, FIG. 7A depicts three 128 optical fiber ferrules 300 in an alignment tube, sub-light guide alignment tube or ferrule 210, each of these ferrules 300 containing the fibers 320 from one fully assembled CSM. FIG. 7B depicts a sectional view of the assembly of optical fiber ferrules of FIG. 7A taken along line A-A illustrating the terminated fiber interfaces 310. In the illustrated embodiment, three ferrules 300 are shown disposed or positioned in ferrule 210.

FIGS. 8A & 8B depict one embodiment of a ferrule 300. FIG. 5A depicts an elevational view of one ferrule 300 containing 128 optical fibers of one assembled CSM, while FIG. 8B depicts an end view of the ferrule 300 of FIG. 5A, illustrating the terminated polished fiber face 310 contained therein.

FIGS. 9A-9C depict one embodiment of an optical fiber ferrule 720 adapted to be coupled to or located in the apex of a concave mirror 710 (secondary reflective surface). FIG. 9A depicts a section view of the optical fiber ferrule 720 (a plurality of ferrules are contemplated) for securing and terminating a single optical fiber 610. FIG. 9B depicts a view of a polished end 722 of the optical fiber ferrule 720 of FIG. 9A, while FIG. 9C depicts the fiber threading end 724 of the optical fiber ferrule 720.

FIGS. 10A & 10B depict an embodiment of the secondary reflective surface similar to that provided previously. FIG. 10A depicts a side cross sectional view of the assembly of the concave mirror 710 and locked in place of the optical fiber ferrule 720 similar to that of FIGS. 9A-9C. FIG. 10B depicts a plan view of the concave mirror 710 of FIG. 10A illustrating the fiber terminated end 722 of the ferrule 720 coupled to or located in the apex 712 of mirror 710.

FIGS. 11A-11C depict an embodiment of the concave mirrors (secondary reflective surfaces) and mirror clamp 730. FIG. 11A depicts a flat clamp 730 adapted to hold down a plurality of concave mirrors 710 (a total of 32 concave mirrors are contemplated). FIG. 11B depicts a cross sectional view of the mirror clamp 730 of FIG. 11A taken along line A-A illustrating one embodiment of the clamp 730 used to secure the mirrors. FIG. 11C depicts an enlarged cross sectional view of detail A of FIG. 11B, showing a typical step 732 in the clamp 730.

Figures 12A, 12B:
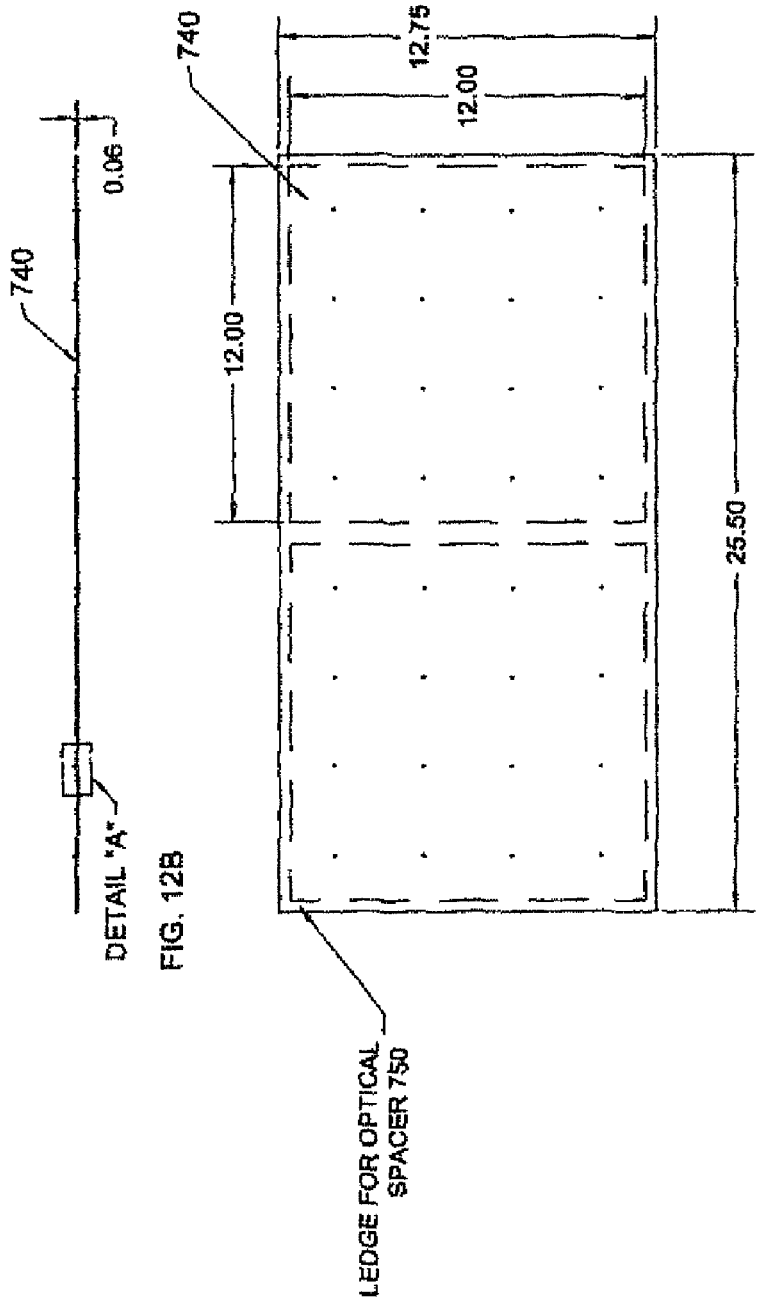
FIG. 12A depicts a plan view of a clear, light transmitting plate that secures the Primary Reflective Surface and allows transmission of sunrays reflected from a concave mirror onto the solar cells.
FIG. 12B depicts a side view of the clear, light transmitting plate of FIG. 12A.

FIGS. 12A & 12B depict one embodiment of the clear, light transmitting plate 740 similar to that provided previously. FIG. 12A depicts a plan view of a clear, light transmitting plate 740 that secures the primary reflective surface and allows transmission of sunrays reflected from a concave mirror 710 onto the solar cells 900. FIG. 12B depicts a side view of the clear, light transmitting plate of FIG. 12A. FIG. 12C depicts enlarged detail A of light transmitting plate 740 of FIGS. 12A & 12B, showing a typical hole 742 that secures the primary reflective surface or convex mirror 800. In at least one embodiment, each plate 740 has an assembled dimension of about 12"×24"×0.063".

FIGS. 13A-13C depict an embodiment of an optical spacer 750 as provided previously. FIG. 13A depicts a plan view of an optical spacer 750 providing the predetermined fixed distance between the concave mirror 710 and the photovoltaic cell 900 required for expansion of the reflected sunrays from the concave mirror. FIG. 13B depicts a side view of the optical spacer 750 of FIG. 13A. FIG. 13C depicts an elevational view of the optical spacer 750 of FIGS. 13A-13B. In at least one embodiment, each spacer 750 has an assembled internal dimension of about 12"×12"×1.250". The internal dimension of this embodiment allows installation of a 2×2 array of PV cells.

FIGS. 14A & 14B depict an embodiment of a primary reflective surface or convex mirror 800 similar to that provided previously. FIG. 14A depicts an end view of a primary reflective surface or convex mirror 800 for reflection of sunbeam emerging from the fiber optics terminated in ferrule 720 onto the concave mirror or secondary reflective surface 710. In at least one embodiment, mirror 800 comprises a front surface mirror, nickel or enhanced aluminum coated or some combination thereof. FIG. 14B depicts a side view of the convex mirror 800 of FIG. 14A, showing the end that is inserted and secured in hole 742 of the reflective plate 740.

FIGS. 15A-15C, 16A & 16B and 17 depict various plates used with one embodiment of an assembled CSM as provided previously. FIG. 15A-15C depict different views of side channel or plate 1000 adapted to assemble a complete CSM. In at least one embodiment, as shown in FIG. 15B, side plates 1000 are designed such that when the modules are assembled into one CSM, an air gap 1400 of about 1½" is created between the two half module sets, such air gap 1400 adapted to keep the photocells cool. The air gaps 1400 act as a chimney, allowing air circulation between the module sets (See FIGS. 4B, 5B, 5C & 5D). FIGS. 16A and 16B depict about ½ of top end plate 1200 for covering the assemble CSM and threading thru and securing the optical fibers from the sub-CSM. In at least one embodiment, plate 1200 is made of two identical halves, which simplifies threading through of 128 optical fibers that are terminated in their respective ferrules and are assembled into the light-guide and sub-CSMs. FIG. 17 depicts a plan view of a bottom plate 1100 for covering the assembled CSM.

Embodiments of the present invention are adapted to allow installation of the compact solar modules in any location in a building or house. Such embodiments provide for use of as many modules as required to charge batteries during the off sun hours. Further, one or more embodiments supply the building with the needed energy during the sunny hours. One embodiment of the invention is depicted for use with a house or building 2000 as illustrated in FIGS. 18A & 18B. FIG. 18A depicts a partial view of a rooftop 2010 of building 2000 having a southern orientation and illustrating one example of an assembled CSM 2012 (similar to any of the embodiments provided previously) for providing electricity. Two light-guide-tubes 120 and lens 110 can be seen protruding out of the roof. FIG. 18B depicts a partial view of rooftop 2010 similar to that of FIG. 18A having a northern orientation illustrating an assembled CSM 2012 hidden behind the vertical wall 2013, which accommodates the air transfer grilles. FIG. 18C depicts a cross sectional view of the building 2000 of FIG. 18B taken along line A-A illustrating a plurality of modules 2012 installed in a dedicated room 2014 under the roof 2010 and the penetration of the optical guides therethrough using a guide pipe 2016 for example. The depicted embodiments comprise an array of 4 concave mirrors, which illuminates a single 6"×6" solar cell. The combination of 4 concave mirror/fiber optics-carrying sunrays will flood one photocell in its entirety. Additionally, a segment of the 4 circular beams of light, incident on one cell, overlap. This increases total light intensity incident on the surface of the solar cell.

In at least one embodiment, at least 1 but generally each compact solar module or CSM comprises two arrays of 4×16 cells (i.e., a total of 64 cells) containing 6"×6" Photovoltaic solar cells, which are installed back-to-back. One example of such back-to-back assembly of two sub CSMs is illustrated in FIGS. 5B & 5C. The illustrated module is 2'×8'×7.6". However, other dimensions and assembly configurations are contemplated, as the design has been modularized for ease of fabrication, assembly and availability of headroom in the selected indoor space.

The illustrated sub-CSM 2012 contains 8 solar cells installed in a 1'×2' frame, complete with two optical spacers (spacers 750 for example, best viewed in FIGS. 4 & 13A-13C) one clear plate (clear plate 740 for example best viewed in FIGS. 12A & 12B) 32 primary reflective surfaces (convex mirrors 800 for example best viewed in FIGS. 14A & 14B, although concave mirrors or some combination of convex and concave mirrors is also contemplated), 32 secondary reflective surfaces (concave mirrors 710 for example best viewed in FIGS. 4A, 5A-5C, 6 & 10A & 10B although convex mirrors or some combination of concave and convex mirrors are contemplated), one mirror clamp (clamp 730 for example best viewed in FIGS. 11B & 11C), 32 optical fiber terminated ferrules (ferrules 720 approximately 1 mm in diameter for example and best viewed in FIGS. 4A & 4B, 5A & 5B, 6, 9A-9C & 10A & 10B), 32 optical fibers (fibers 610 for example, each optical fiber approximately 1 mm in diameter and best viewed in FIGS. 3, 4A & 4B, 5A-5C & 6), 8 couplers (couplers 400 for example best viewed in FIGS. 3, 4A, 5A & 6) and 8-2 mm in diameter optical fibers (fibers 320 for example best viewed in FIGS. 2, 3, & 4A). The ferrule is designed to terminate the total of 4 optical fibers form each PV set in one complete set of CSMs. Embodiments provide for illumination of three sets of CSM with single light-guide/spherical lens.

In assembling the illustrated CSM of FIG. 18C, a total of 2×8 sub-CSMs, two side plates 1000, one set of top end-plates 1200, and one bottom end-plate 1100 are utilized. The top end plate 1200 is made of two identical halves, which simplifies threading-through and bundling of the terminated optical fibers in their respective ferrules. Optical fibers from every mirror arrangement within the sub-CSM (a total of 64 per side in this embodiment) are threaded through the slots in the top end plate 1200. The edges of the slots are covered, by a rubber grommet for example, to protect the fiber against damage. Finally, two flat metal plates cover the surfaces of the CSM, protecting the mirrors/fiber optics assembly from dust and environmental condition. In at least one embodiment, rubber gaskets are used to seal surfaces of the modules.

A stack of six CSM's assembled back to back in the illustrated embodiment are installed in a dedicated room 2014 under the rooftop 2012. Optical fibers emerging from each sub-CSM of one CSM are bundled collectively, which are terminated and polished in a 128-fibre ferrule. Three of these ferrules attached to three CSM module is inserted in and secured in a light-guide that emerges from the roof of the house. The six CSMs are attached to two light-guide-tubes. The light-guide-tubes are fitted with sun-tracking mechanism that tracks the sun during daylight hours.

The electrical connections between the cells and modules are carried out according to the prior art and industry wide practice. It should however be appreciate that the connections are made such that some cells/modules are connected in series and some in parallel to insure electrical continuity under all conditions.

Figure 19:
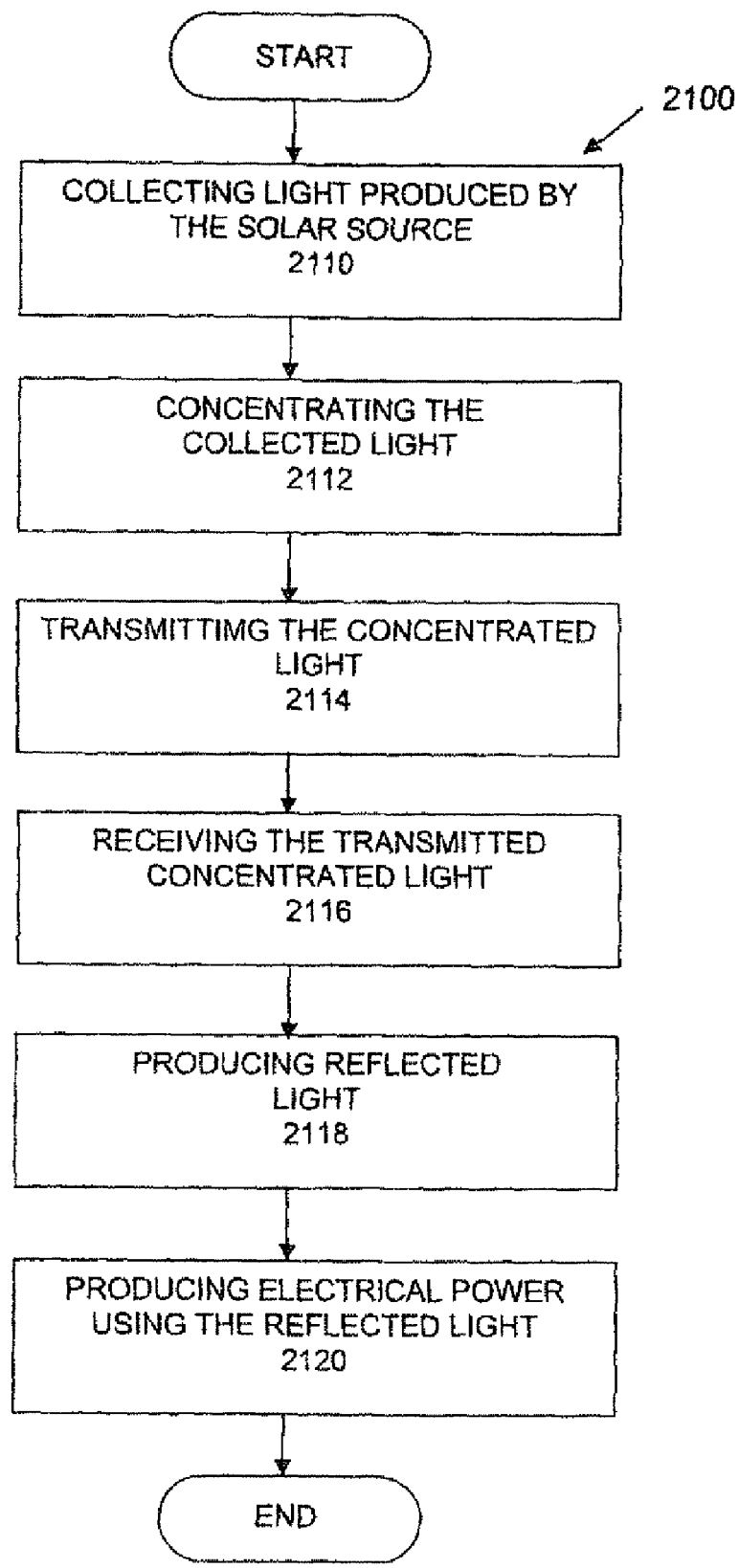
FIG. 19 depicts a high-level flow diagram illustrating one method for illuminating a solar cell using indirect sunrays to generate electrical power using the apparatus or any portion thereof.

FIG. 19 depicts a high-level flow diagram illustrating one method, generally designated 2100, for illuminating a solar cell using indirect sunrays to generate electrical power, using the apparatus, or any portion thereof, described previously. In at least one embodiment, method 2100 comprises collecting light produced by a solar source, block 2110 (using at least one moveable light-guide directed towards the solar source for example). The collected light is concentrated and transmitted, blocks 2112 and 2114 respectively.

Method 2100 further comprises receiving the concentrated light and producing a number of reflected light sources, blocks 2116 and 2118 respectively. In at least one embodiment, the collected light is concentrated on at least one optical fiber transmitted to a remote location, split into 4 and transmitted to at least 4 set of reflective surfaces (primary and secondary reflective surfaces for example). Electrical power is produced using the reflected light, block 2120 using at least one photocell for example, where the electrical power is produced from the reflected light that is incident upon at least one photocell.

Figure 20A:
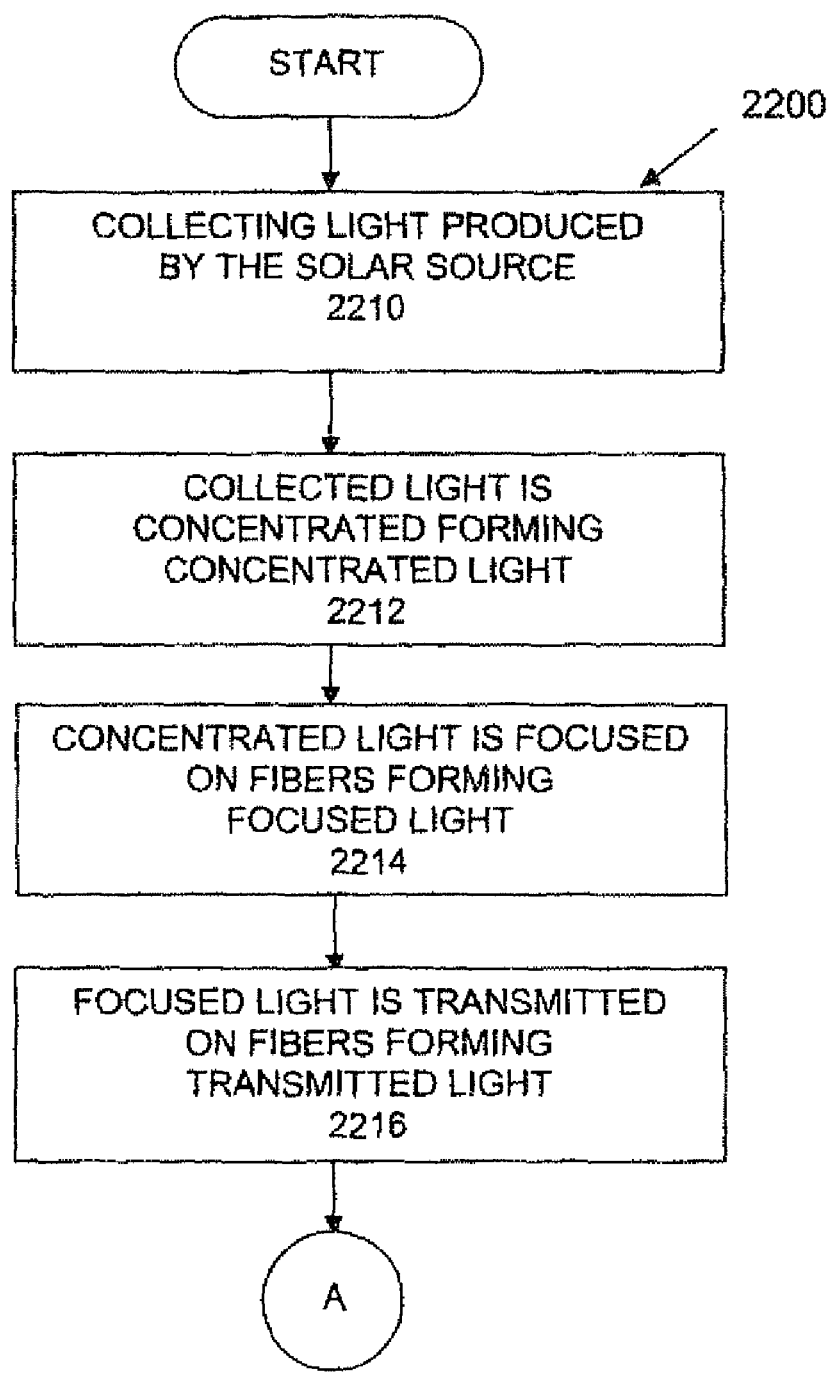
FIGS. 20A & 20B depict a detailed flow diagram illustrating one method for illuminating a solar cell using indirect sunrays to generate electrical power using the apparatus, or any portion thereof.
Figure 20B:
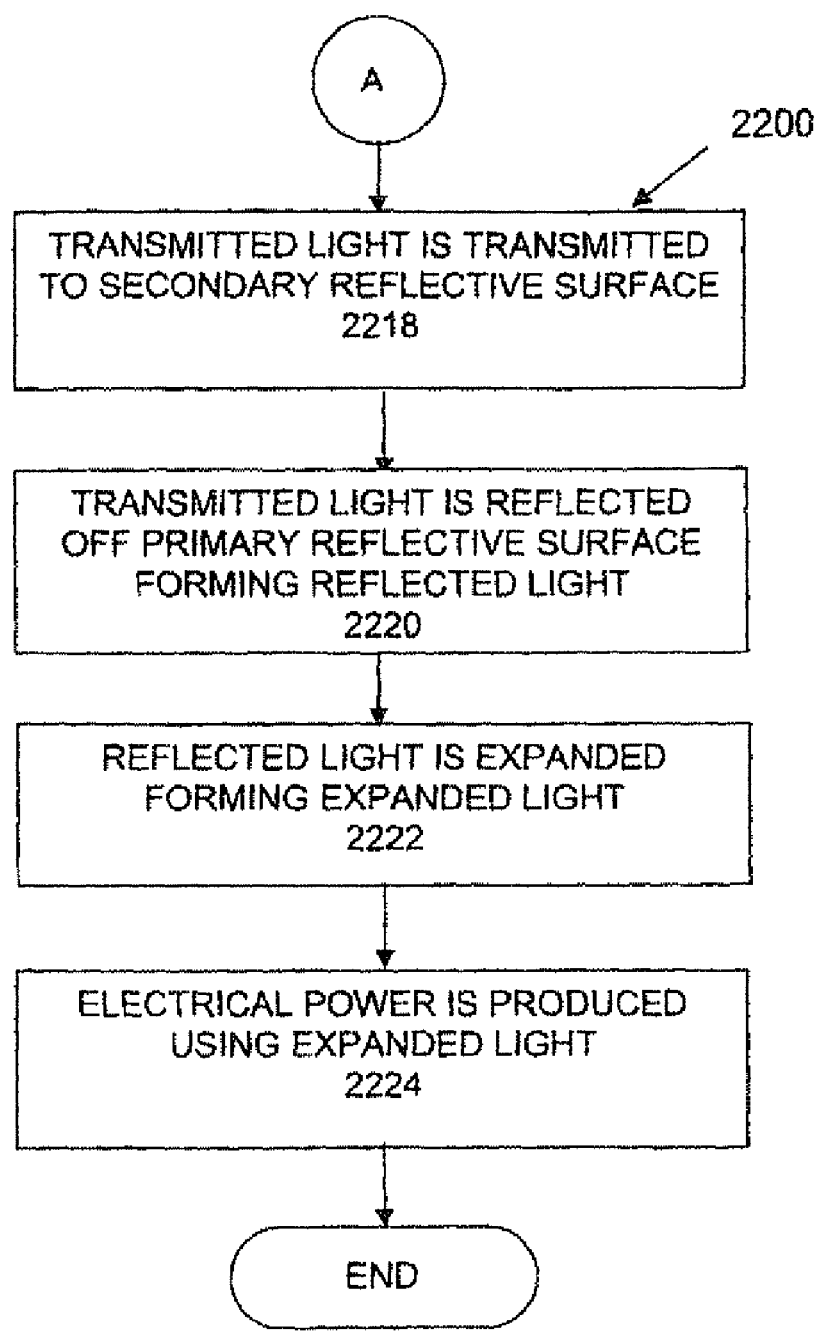

FIGS. 20A & 20B depicts a detailed flow diagram illustrating one method, generally designated 2200, for illuminating a solar cell using indirect sunrays to generate electrical power, using the apparatus, or any portion thereof, described previously. In at least one embodiment, method 2200 comprises collecting light produced by a solar source, block 2210 (using at least one moveable light-guide directed towards and tracking the solar source for example). The collected sunrays are concentrated to a predetermined beam diameter (using a condensing lens for example) forming concentrated light, block 2212. Block 2214 illustrates the concentrated light that is focused onto the polished surface of a first plurality of optical fibers forming condensed high intensity light.

Method 2200 further comprises forming transmitted light, block 2216, by transmitting the focused light from the first plurality of optical fibers to a second plurality of optical fibers using at least one ferrule. Block 2218 illustrates the transmitted light is transmitted to a primary reflective surface or convex mirror using at least the second plurality of optical fibers coupled into an apex (using a ferrule for example) of the secondary reflective surface which is positioned a predetermined fixed distance from the solar cells. The transmitted light is reflected off a primary reflective surface or convex mirror forming reflected light, block 2220, where the primary reflective surface is positioned slightly beyond the focal plane of the secondary reflective surface with an optical axis coincident with the optical axis of the ferrule and/or second plurality of optical fibers coupled to or locked in the apex of the concave mirrors (secondary reflective surface). The reflected light of the convex mirror (primary reflective surface) onto the concave mirror covers the entire surface of the concave mirror. The reflected light from the concave mirror is expanded forming expanded light, block 2222, by reflecting the reflected light off the secondary reflective surface. Electrical power is produced using the expanded light, block 2224 using at least one photocell for example, where the electrical power is produced from the expanded light that is incident upon at least a portion of the photocell.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

The invention claimed is:

1. An apparatus for producing electrical power, the apparatus comprising:
   at least one converter adapted to convert light to electrical power;
   at least one reflector comprising at least one set of primary and secondary reflective surfaces said primary reflective surface spaced from said converter, said secondary reflective surface spaced from said primary reflective surface such that said primary reflective surface is positioned between said secondary reflective surface and said converter, said secondary reflective surface and receiving said light, adapted to produce reflected light that illuminates at least a portion of said converter; and
   a plurality of ferules, at least one ferrule of said plurality of ferrules positioned in said secondary reflective surface and adapted to have light emerge from a polished fiber terminated end thereof, said emerging light provided to said primary reflective surface then reflected to said secondary reflective surface, thereby producing reflected light that illuminates at least a portion of said at least one converter.

2. The apparatus of claim 1 comprising a frame, wherein at least said converter is joined to said frame.

3. The apparatus of claim 1 wherein said converter comprises at least one solar cell.

4. The apparatus of claim 1 wherein said reflector is adapted to receive light and produce expanded light that illuminates an entire surface of at least one of said primary and secondary reflective surfaces.

5. The apparatus of claim 4 wherein said primary reflective surface comprises at least one of a spherical convex mirror and a concave mirror.

6. The apparatus of claim 5 wherein at least one of said spherical convex mirror and said concave mirror has a coated surface, wherein said coating is a material selected from the group comprising nickel or enhanced aluminum or some combination thereof.

7. The apparatus of claim 4 wherein said secondary reflective surface comprises at least one of a concave and convex mirrors.

8. The apparatus of claim 7 wherein said concave and convex mirrors have a coated surface, wherein said coating is a material selected from the group comprising nickel or enhanced aluminum or some combination thereof.

9. An apparatus for producing electrical power, the apparatus comprising:
   a frame;
   at least one solar cell positioned in said frame and adapted to convert light from sunrays to electrical power;
   at least one set of primary and secondary reflective surfaces said primary reflective surface spaced from said solar cell, said secondary reflective surface spaced apart from said primary reflective surface such that said primary reflective surface is positioned between said secondary reflective surface and said at least one solar cell, said secondary reflective surface adapted to produce reflected light that illuminates substantial portions of a surface of said primary reflective surface and said solar cell; and
   a plurality of ferrules, at least one ferrule of said plurality of ferrules positioned in at least one of said primary and secondary reflective surfaces and adapted to have light emerge from an end thereof.

10. The apparatus of claim 9 wherein said primary reflective surface comprises a spherical convex mirror having a coated first surface, wherein said coating is a material selected from the group comprising nickel or enhanced aluminum or some combination thereof.

11. The apparatus of claim 9 wherein said secondary reflective surface comprises a concave mirror having a coated surface, wherein said coating is a material selected from the group comprising nickel or enhanced aluminum or some combination thereof.

12. The apparatus of claim 9 wherein said ferrule is coupled to said secondary reflective surface, wherein light emerging from a polished surface of an optical fiber terminated in an end of said ferrule forms a light source to said primary reflective surface.

13. A method for producing electrical power using a compact solar module apparatus, the method comprising:
   collecting and concentrating sunrays;
   transmitting said collected and concentrated sunrays to the remotely located compact solar module apparatus;
   forming reflected light in the remotely located compact solar module apparatus using primary and secondary reflective surfaces and at least one solar cell, said primary reflective surface positioned between said secondary reflective surface and said solar cell, and light emerging from a polished end of a optical fiber terminated in a ferrule positioned in said secondary reflective surface;
   expanding said reflected light in the remotely located compact solar module apparatus, forming expanded light that illuminates a surface of at least one solar cell; and
   converting said expanded light into electrical power in the remotely located compact solar module apparatus.

14. The method of claim 13 wherein said reflective surface comprises at least one concave mirror and at least one convex mirror.

15. The method of claim 14 wherein said at least one concave or convex mirror has a coated surface, wherein said coating is a material selected from the group comprising nickel or some combination of nickel and enhanced aluminum.

16. The method of claim 13 wherein forming said reflected light comprises receiving transmitted light using at least one set of optical fiber cables.

* * * * *